US006930944B2

(12) United States Patent
Hush

(10) Patent No.: US 6,930,944 B2
(45) Date of Patent: *Aug. 16, 2005

(54) SYSTEM AND METHOD FOR POWER SAVING MEMORY REFRESH FOR DYNAMIC RANDOM ACCESS MEMORY DEVICES AFTER AN EXTENDED INTERVAL

(75) Inventor: Glen Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

This patent is subject to a terminal disclaimer.

(21) Appl. No.: 10/418,945

(22) Filed: Apr. 18, 2003

(65) Prior Publication Data

US 2004/0032782 A1 Feb. 19, 2004

Related U.S. Application Data

(63) Continuation of application No. 10/002,707, filed on Oct. 24, 2001, now Pat. No. 6,560,155.

(51) Int. Cl.[7] ............................................ G11C 11/00

(52) U.S. Cl. ....................... 365/222; 365/194; 365/233; 365/236

(58) Field of Search ................................ 365/222, 194, 365/233, 236, 238.5

(56) References Cited

U.S. PATENT DOCUMENTS

| | | | | |
|---|---|---|---|---|
| 5,031,147 A | * 7/1991 | Maruyama et al. | ..... | 365/189.07 |
| 5,991,851 A | 11/1999 | Alwais et al. | .............. | 711/106 |
| 6,310,819 B1 | 10/2001 | Cowles et al. | ......... | 365/230.06 |
| 6,392,948 B1 | 5/2002 | Lee | ............................ | 365/222 |
| 6,560,155 B1 | 5/2003 | Hush | .......................... | 365/222 |
| 6,731,528 B2 | 5/2004 | Hush et al. | ................. | 365/100 |
| 6,751,114 B2 | 6/2004 | Gilton et al. | ............... | 365/100 |
| 6,791,859 B2 | 9/2004 | Hush et al. | ................. | 365/100 |
| 6,791,885 B2 | 9/2004 | Casper et al. | .......... | 365/189.07 |
| 6,813,176 B2 | 11/2004 | Gilton et al. | ............... | 365/100 |
| 2003/0095426 A1 | 5/2003 | Hush et al. | ................. | 365/148 |
| 2003/0117831 A1 | 6/2003 | Hush | .......................... | 365/148 |
| 2003/0156468 A1 | 8/2003 | Campbell et al. | ........... | 365/200 |
| 2003/0173558 A1 | 9/2003 | Campbell | .................... | 257/10 |
| 2003/0206433 A1 | 11/2003 | Hush et al. | ................. | 365/160 |
| 2004/0044841 A1 | 3/2004 | Gilton | ........................ | 711/106 |
| 2004/0071042 A1 | 4/2004 | Moore et al. | ............... | 365/232 |
| 2004/0228164 A1 | 11/2004 | Gilton | ........................ | 365/154 |

* cited by examiner

*Primary Examiner*—Son T. Dinh
(74) *Attorney, Agent, or Firm*—Dorsey & Whitney, LLP

(57) ABSTRACT

A delay device is added to the addressing and refreshing circuitry of a DRAM array including DRAM devices less volatile than conventional DRAM devices and, thus, need not be refreshed as often. The delay device is connected to intercept refresh signals generated by a conventional DRAM refresh controller and initiates a refresh cycle after disregarding a predetermined number of refresh signals generated by the refresh controller whose total duration equals the interval by which the less volatile DRAM devices must be refreshed. The delay device also is adapted to power off circuitry needed to address the DRAM devices when the DRAM devices are not being refreshed or otherwise accessed. Additional circuitry is added to selectively power on only specific addressing devices actually needed to address those certain portions of the array being refreshed at that time.

148 Claims, 11 Drawing Sheets

SYSTEM AND METHOD FOR POWER SAVING MEMORY REFRESH FOR DYNAMIC RANDOM ACCESS MEMORY DEVICES AFTER AN EXTENDED INTERVAL

CROSS-REFERENCE TO RELATED APPLICATION

This application is a continuation of pending U.S. patent application Ser. No. 10/002,707, filed Oct. 24, 2001, now U.S. Pat. No. 6,560,155 which is hereby incorporated by reference in its entirety.

TECHNICAL FIELD

The present invention is directed to dynamic random access memory (DRAM) devices, and, more particularly, to a system and method for saving power while refreshing DRAM devices such as programmable conductor DRAM (PCDRAM) devices which only need to be refreshed after an extended interval.

BACKGROUND OF THE INVENTION

Most computers and other digital systems have a system memory which often consists of dynamic random access memory ("DRAM") devices. DRAM devices are fairly inexpensive because a DRAM memory cell needs relatively few components to store a data bit as compared with other types of memory cells. Thus, a large system memory can be implemented using DRAM devices for a relatively low cost. However, DRAM devices have the disadvantage that their memory cells must be continually refreshed because of the inherently transitory nature of their storage technology.

Generally a DRAM memory cell consists of a transistor/capacitor pair. High and low voltages stored in the capacitor represent logical one and zero data bits, respectively. In a basic DRAM memory cell, one plate of the capacitor is connected to the drain of the transistor, and the other plate is connected to ground. A data bit is written to the cell by enabling the gate of the transistor and applying a voltage corresponding to the data bit to be written to the transistor's source. The enabled transistor conducts the voltage to the capacitor, charging the capacitor and storing the data bit. When the transistor is disabled, the data bit remains stored. Re-enabling the transistor reconnects the capacitor to the source of the transistor, and the stored voltage representing the data bit can be read at the source.

The foregoing is a simplified view, ignoring two considerations presented by the physical nature of the capacitor used in the memory cell. First, a capacitor can hold a voltage only briefly. The smaller the capacitor, the shorter is the duration for which the voltage can be stored. In a DRAM memory device containing thousands of memory cells on a single piece of a semiconductor wafer, these capacitors are infinitesimal, and can only reliably maintain a voltage for microseconds. Consequently, these memory cells must be refreshed thousands of times per second. Second, because these stored voltages dissipate so rapidly, reading the voltage after just a short interval requires a sense amplifier. The use of a sense amplifier is well known in the art to detect whether a stored voltage is high or low, and drive it toward the appropriate binary voltage parameter of the digital device. Fortunately, reading each cell using a sense amplifier not only reads the bit stored in the cell, but also simultaneously refreshes the voltage stored in that cell. The use of sense amplifiers to read and refresh DRAM memory cells is well known in the art. In the interest of brevity, the details of their operation will not be recounted here.

Constantly refreshing DRAM memory cells presents two problems. First, refreshing memory cells slows the useful function of the memory. Memory cells are presented in arrays of rows and columns, often thousands of rows deep and thousands of columns wide. Even though entire rows of an array are refreshed at a time, it still requires thousands of refresh operations to refresh every row in the array. Moreover, these memory arrays cannot be accessed during a refresh cycle. Unless the memory array is equipped with a dual accessing mechanism, a row cache device, or similar means, the array can be neither read from nor written to during a refresh cycle without interrupting or destroying the cycle. If the central processing unit or other controller initiates a memory read or write operation during a refresh cycle, the processor or controller will have to wait for completion of that refresh cycle. This waiting slows processing throughput.

Second, and even more problematic than processing delays, is the power consumed in the continual, rapid refreshing of these memory cells. Thousands of times per second, the gate of each transistor in each memory cell across the entire DRAM array must be activated to refresh the array. Resistance of the conductors through the memory array to address each and every transistor, in each and every row, in each and every column, consumes considerable power. More power is consumed by transistors used in the sense amplifiers which read and refresh the memory cells in respective columns. Still further, supporting circuitry needed to access the rows of memory cells, such as a refresh counter, row multiplexers, row decoders, and address latches, uses even more power.

A simplified view of a typical, conventional DRAM memory array is depicted in FIGS. 1 and 1A. Both show part of a 256 Mb array 110 which stores data in two conventional DRAM memory banks 112 and 114. Each memory bank 112 and 114, for example, has 8,192 rows of memory cells, for a total of 16,384 rows. The figures are simplified most notably in the sense that they omit components such as column address multiplexers, column address latches, and column decoders. As is well known, reading from or writing to a memory bank requires both a row and a column address to identify the specific memory location where the data is or will be stored. Both row and column addressing circuits are needed to read from and write data to the memory banks. On the other hand, refreshing a memory bank is typically performed by reading and thereby refreshing an entire row at a time across each memory bank, and column addresses are irrelevant. The invention described in this application is directed to a system and method for refreshing a memory array, thus column addressing is not germane. Further discussion of column addressing means has been omitted for the sake of simplicity.

A memory array can be refreshed in either a burst refresh mode or a distributed refresh mode. Using a burst refresh mode, every row of a memory array is sequentially refreshed in rapid succession. Then, after every passage of a predetermined interval, every row of the memory array again is refreshed in rapid succession. The maximum duration of the predetermined interval is the span of time after which the data stored in the DRAM array begins to degrade less the time required to sequentially refresh every row in the array. This standard interval is necessarily brief considering the rapid refreshing needs of a conventional DRAM device.

FIG. 1 depicts a system memory which employs burst refresh. A refresh controller 120 generates a refresh signal after the passage of the predetermined interval. Incremented by each pulse of a refresh clock 122, a refresh counter 124 sequences through a series of 14-bit binary numbers. The 14-bit binary number equates to one of $2^{14}$ or 16,384 numbers, one of which uniquely corresponds to the address of each row of one of the two memory banks 112 and 114.

Each row in the memory banks 112 and 114 is accessed through a network of addressing circuitry 160 which includes a row address multiplexer 130, row address latch A 150, row address latch B 152, and row decoders 132–142. Depending upon whether the row address generated by the refresh counter 124 refers to a row in memory bank A 112 or memory bank B 114, the row address is directed by the row multiplexer 130 to row address latch A 150 or row address latch B 152, respectively. From the appropriate row address latch 150 or 152, five bits of the 14-bit address uniquely identify one of the $2^5$ or sixteen row decoders 132–142 associated with each memory bank. The remaining nine bits of the address uniquely correspond to one of the $2^9$ or 512 rows addressed by each row decoder 132–142. Only a few of the sixteen row decoders needed for each memory bank 112 and 114 are shown in the figures for the sake of visual clarity.

After supplying the address of a row to the appropriate memory bank 112 or 114, that row will be read and thereby refreshed by sense amplifiers incorporated in each memory bank 112 and 114. In this manner, the entire memory array is refreshed, row by row. Once the refresh counter 124 has sequenced through all 16,384 row addresses, the refresh cycle is over. The refresh counter 124 and the addressing circuitry 160 sit idle, consuming power, awaiting the next refresh signal from the refresh controller 120 or the next external address signal 126.

Using a distributed refresh mode, one row of the memory array is refreshed, then, after passage of a predetermined interval, the next row of the array is refreshed. This process is repeated until every row in the memory array is refreshed. The predetermined interval between the refreshing of each row is far shorter than the predetermined interval between refresh cycles in a burst refresh context. The maximum duration of the predetermined interval between row refreshes is the span of time after which the data stored in the DRAM array begins to degrade, less the time required to sequentially refresh every row in the array, divided by the number of rows in the array. In other words, all other variables being equal, the predetermined interval in the distributed refresh mode would be equal to the predetermined interval in the burst refresh mode divided by the number of rows in the memory array. For example, assuming that the span of time after which the data stored in the DRAM array begins to degrade and the total time to refresh the rows themselves is equal to that for the DRAM array refreshed in a burst refresh mode, and there are 8,192 rows in the array, the predetermined interval between row refreshes in a distributed refresh would be 1/8,192 as long as the predetermined interval between array refreshes in a burst refresh.

FIG. 1A depicts a system memory which employs distributed refresh. The refresh cycle in a distributed refresh mode is largely similar to the refresh cycle in a burst refresh mode, as reflected by how similar FIG. 1A is to FIG. 1. The essential difference in a memory system employing distributed refresh is that there is not a single signal from the refresh controller 120 which initiates a refresh of the entire memory array. Instead, after each passage of the much shortened predetermined interval, the refresh controller 120 generates a refresh signal that causes one row of either memory bank A 112 or memory bank B 114 to be refreshed. The refresh controller 120, instead of enabling a rapid count of the refresh counter 124 through its entire sequence, pulses the refresh counter 124 causing its count to be incremented by one. This row address is passed to the addressing circuitry 160 which reads and thereby refreshes one row of the array in an identical manner as to how each row of the memory array is refreshed in a burst refresh. Then, after the passage of another much shortened predetermined interval, the refresh controller 120 emits another refresh signal which increments the refresh counter 124, which, in turn, causes the next row in the memory array to be read and refreshed. This process repeats continually.

Regardless of which mode of refresh is employed, merely the number of devices needed to refresh the array suggests that significant power is consumed in refreshing the array. Moreover, in an actual system memory, power would have to be supplied to eight times as many memory cells and decoders for every byte of data stored. For example, to store 256 MB of data, eight parallel 256 Mb arrays are needed, each of which has its own two banks of memory cells, sixteen row decoders, two row address latches, and a row address multiplexer. The aggregate amount of power used to refresh the cells throughout an entire system memory becomes relatively immense.

The power expended in these refresh cycles is a significant problem. Most significantly, excessive power consumption quickly exhausts battery power in increasingly popular portable computing devices. The consumption of this power also generates a great deal of heat. For all the power expended in refreshing these DRAM memory cells, an additional—and substantial—quantity of power is expended by cooling fans in eliminating the waste heat produced during these refresh cycles.

Much of the power wasted in refreshing DRAM memory could be saved by using less volatile DRAM devices. Instead of having to be refreshed thousands of times per second, after the passage of only a brief interval, less volatile DRAM devices only need to be refreshed after the passage of an extended interval. For one example, programmable conductor dynamic random access memory (PCDRAM) devices need to be refreshed far less frequently than conventional DRAM devices. One known form of PCDRAM memory cell 200, as depicted in FIG. 2A, uses a conducting layer 202, which may be comprised of silver, applied to an insulating layer 204, which may be comprised of glass. The conducting layer 202 and insulating layer 204 are perpendicularly disposed in a frame of insulating material 206. Conducting plates 208 and 210 are disposed on outermost surfaces of the conducting layer 202 and insulating layer 204, respectively. Tautologically, the conducting layer 202 conducts, whereas the insulating layer 204 does not conduct. When a low voltage is applied across the conducting plates 208 and 210, the voltage will not be conducted because it will be blocked by the insulating layer 204. Therefore, the memory cell is 200 not conductive in its initial state.

However, applying a relatively high voltage across the conducting plates 208 and 210 causes the cell to become conductive by changing the structure of the cell 200. FIG. 2B depicts the same memory cell 200 after a relatively high voltage has been applied. The relatively high positive voltage forces dendrils 212 of the material from the conducting layer 202 through the insulating layer 204 toward the conducting plate 210 disposed on the insulating layer 204. Formation of the dendrils 212 of material from the conducting layer 202 through the insulating layer 204 is caused by the charged metal particles being attracted and repelled by fields of differing or similar charge, respectively. This phenomenon is known, and will not be described further here in the interest of brevity.

Because the voltage has driven dendrils 212 of material from the conducting layer 202 through the insulating layer 204 to contact the conducting plate 210 on the opposite surface of the insulating layer 204, the cell 200 becomes conductive. The cell 200 will now conduct when even low voltages are applied, thus, this cell effectively now stores a logical one which later can be read by the system associated with the memory cell 200.

The memory cell 200 can also be reprogrammed to store a logical zero. As shown in FIG. 2C, after application of a relatively high voltage of reverse polarity, i.e., with the positive voltage applied to the conducting plate 210, reverses the migration of the dendrils 212 of material from the conducting layer. The dendrils 212 of material from the conducting layer 202 passing through the insulating layer 204 are forced back toward the conducting layer 202 and out of the insulating layer 204 by the same natural attraction and repulsion of charges which originally caused the cell to be programmed. This relatively high voltage of reverse polarity causes the memory cell 200 to become nonconductive once more. When a lesser voltage is applied, the memory cell 200 will no longer conduct. Thus, and the cell now effectively stores a logical zero. In sum, higher voltages of opposite sense can be used to program and reprogram these cells to conduct or not conduct, storing logical ones or zeroes, respectively.

The PCDRAM memory cell 200 described is far less volatile than a conventional DRAM memory cell. Without being refreshed, a conventional DRAM cell only can maintain its logical bit for microseconds, while the PCDRAM memory cell 200 potentially can maintain its logical bit for days. Eventually, natural diffusion of the material from the conducting layer 202 into and out of the insulating layer 204 resulting from ordinary atomic motion will corrupt the data stored. Nonetheless, PCDRAM devices need only be refreshed after an extended interval, thus, less power is needed to refresh these devices than is needed for the frequent refreshing required by conventional DRAM devices.

The problem remains that systems designed to work with conventional DRAM arrays are very common and standardized. One might substitute an array of PCDRAM memory cells in place of an array of conventional DRAM cells. However, power still would be wasted because control systems designed to work with conventional DRAM cells would refresh the PCDRAM cells at a rate consistent with the refresh rate requirements of conventional DRAM cells. The PCDRAM memory cells would be refreshed at a rate that is significantly higher than is required, wasting power.

The need to redesign circuitry interfacing with the DRAM devices to take advantage of the power savings possible with PCDRAM devices may, at least initially, limit the usefulness of and market demand for PCDRAM devices. What is needed is a way to allow circuitry developed to refresh conventional DRAMs to work with PCDRAMs without wasting power. It is to this need that the present invention is directed.

SUMMARY OF THE INVENTION

Through the addition of refresh signal delay means, an array comprised of less volatile DRAM devices, which only need to be refreshed after an extended interval, can be refreshed less frequently, consuming less power, while still using conventional DRAM refreshing control circuitry. The delay means delays externally generated refresh signals supplied to accommodate the refresh rate required by conventional DRAM memory devices but, in response, generates far less frequent delayed refresh signals. This reduces the frequency with which the less volatile DRAM devices will be refreshed, and powers off supporting addressing circuitry when it is not needed. Therefore, the delay means allows computing systems designed to use conventional DRAM devices to work with DRAM devices which only need to be refreshed after an extended interval and reduces the amount power wasted through unnecessarily frequent refresh cycles.

DETAILED DESCRIPTION OF THE INVENTION

Figure 3:
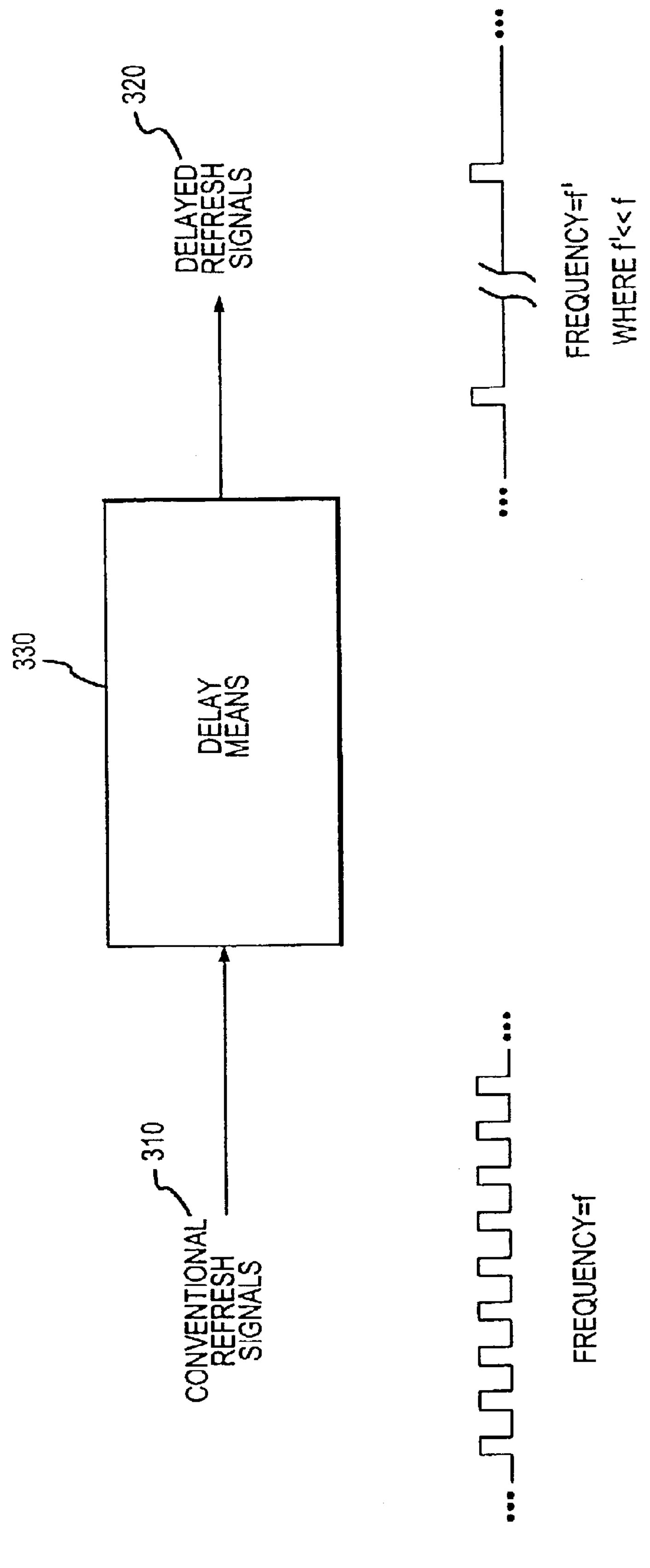
FIG. 3 is a symbolic block diagram generally representing the functioning of embodiments of the present invention.

FIG. 3 represents the basic operation of embodiments of the present invention. External control devices designed to work with conventional DRAM devices will generate frequent conventional refresh signals. These conventional refresh signals 310 will be generated at a frequency f which corresponds to the rapidity with which conventional DRAM devices must be refreshed. Control systems designed to work with DRAM devices that only need to be refreshed after an extended interval generate delayed refresh signals 320 far less often at a frequency f'. As described, conventional DRAM devices might need to be refreshed thousands of times per second, whereas DRAM devices such as PCDRAM cells may only need to be refreshed once per day. In this example, therefore, frequency f could be many orders of magnitude smaller than frequency f. The present invention uses delay means 330 operable to receive the conventional refresh signals 310 and, at appropriately delayed intervals, generate the less frequent delayed refresh signals 320. Thus, with the present invention, external devices designed to work with conventional DRAM devices may be used with DRAM devices which only need to be refreshed after an extended interval, without wasting power on unnecessarily frequent refresh cycles.

Figure 1:
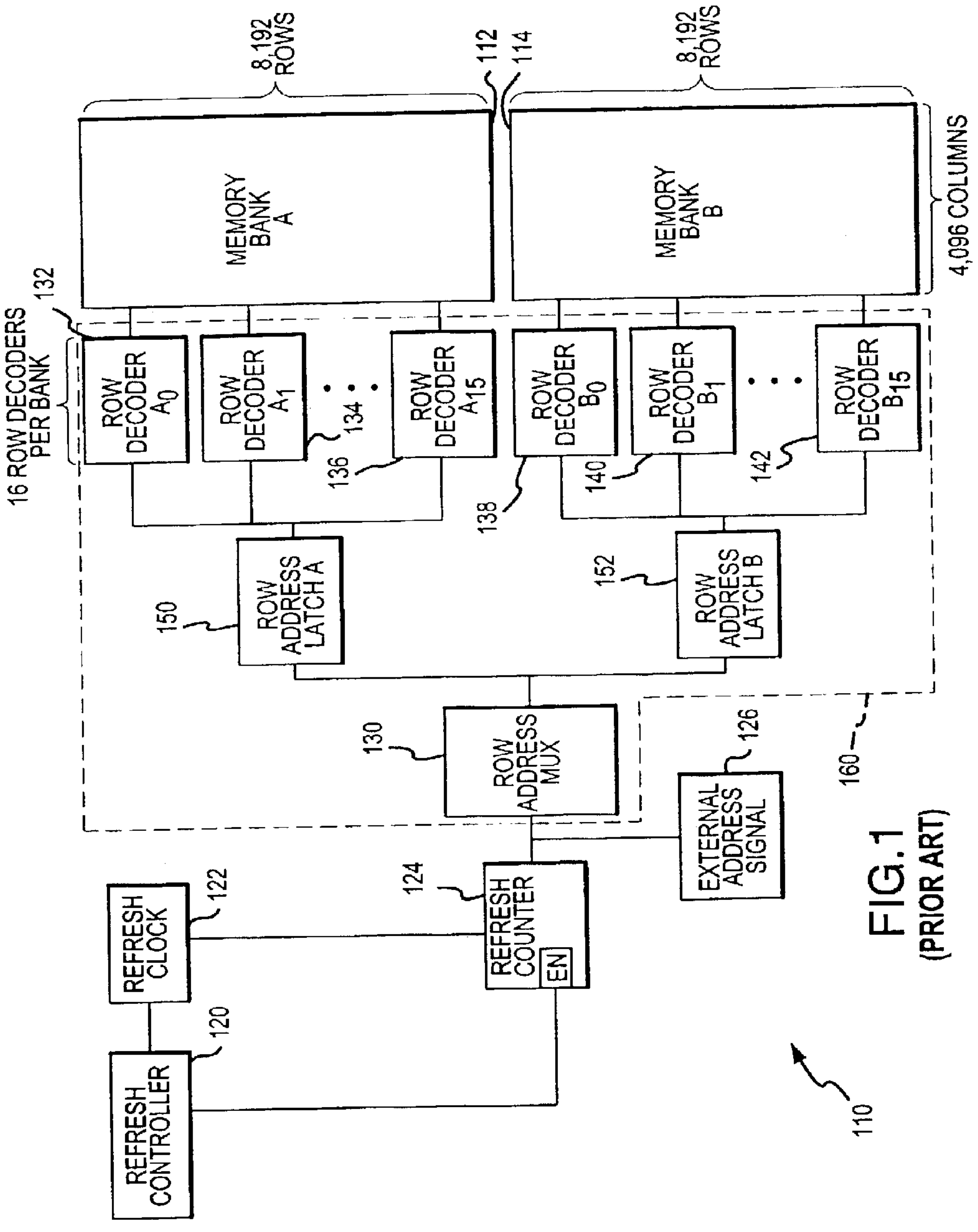
FIG. 1 is a simplified block diagram of a section of a conventional DRAM memory array that may be adapted to use the invention in a burst refresh mode.
Figure 1A:
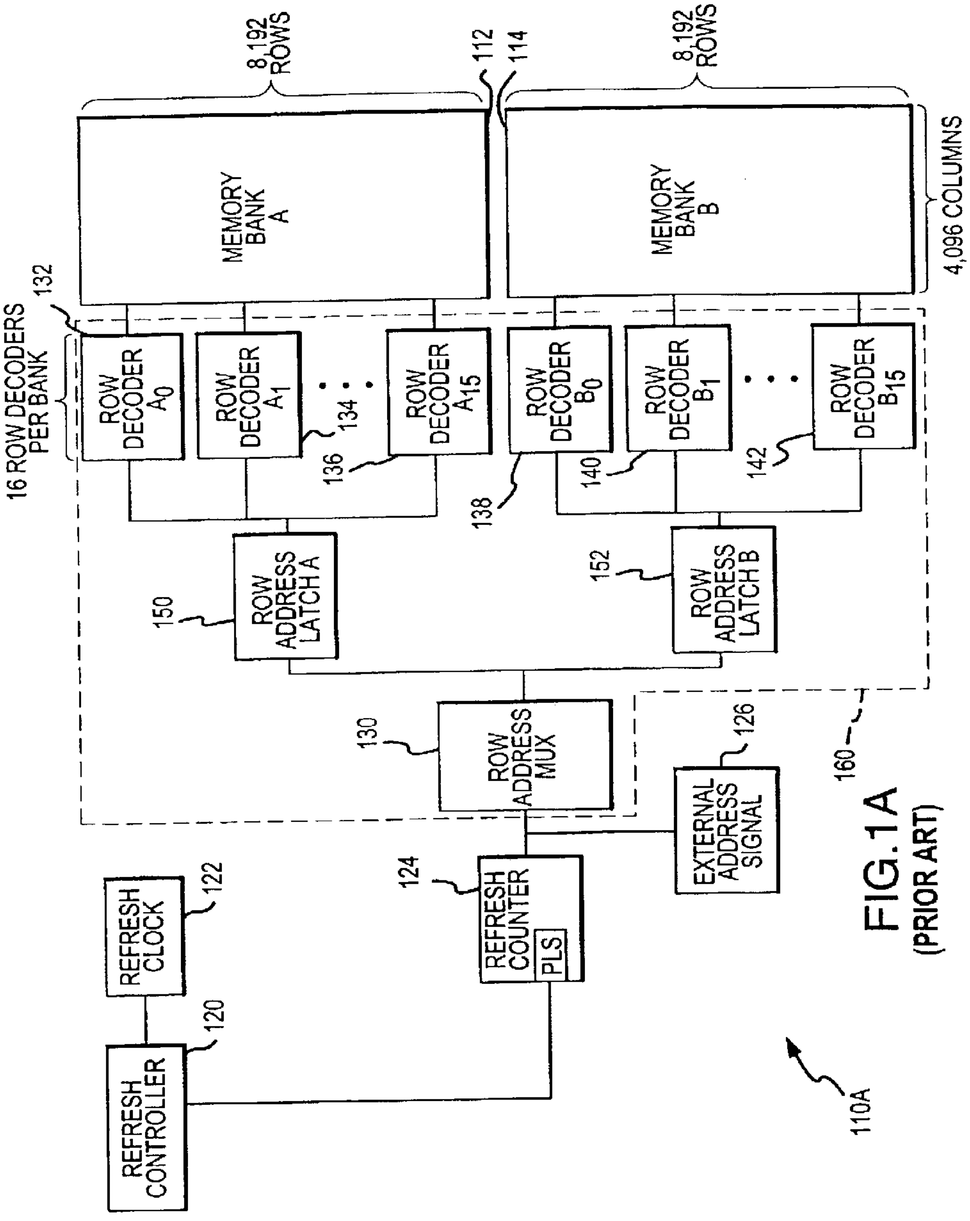
FIG. 1A is a simplified block diagram of a section of a conventional DRAM memory array that may be adapted to use the invention in a distributed refresh mode.
Figure 4:
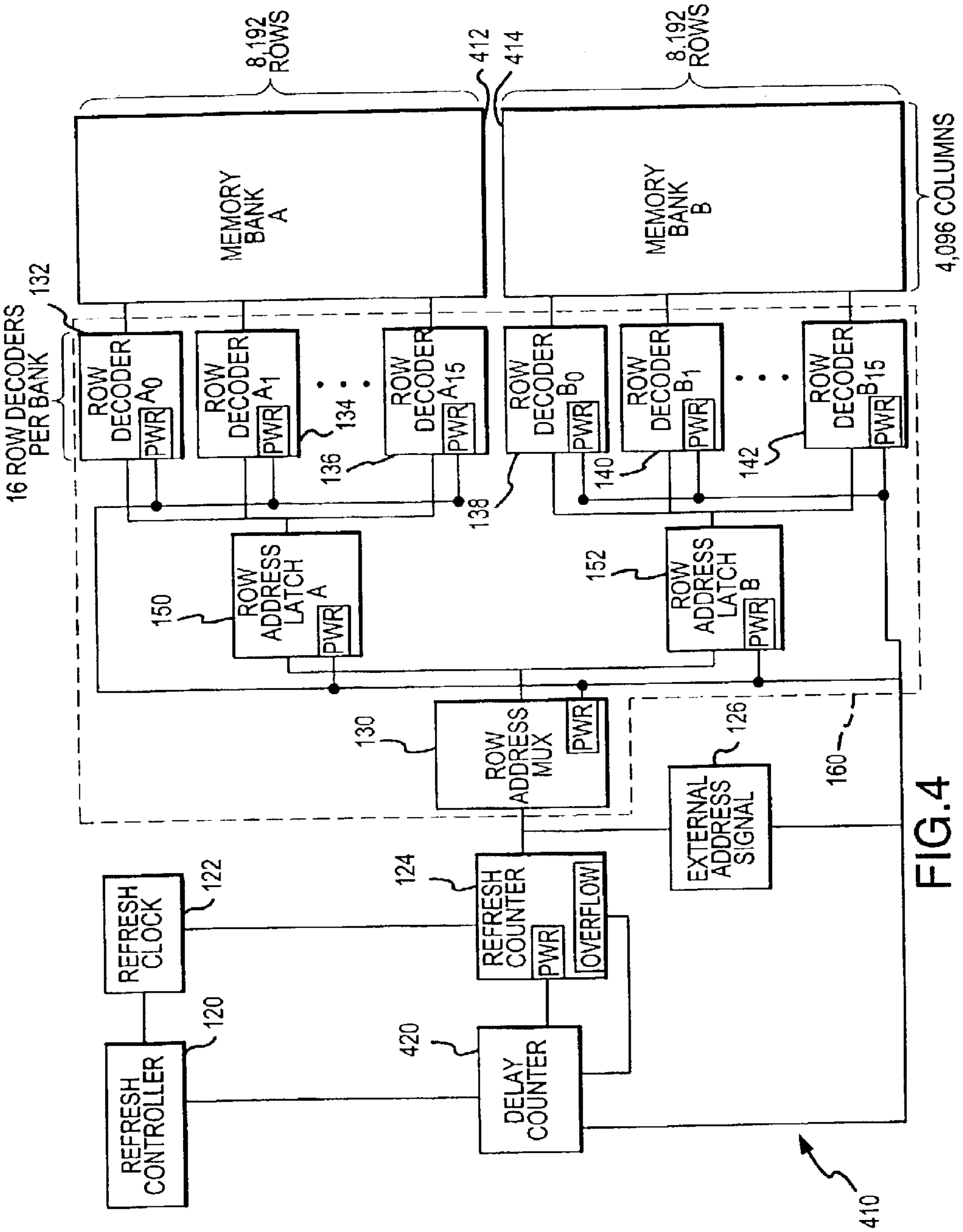
FIG. 4 is a block diagram of the same section of a DRAM memory array depicted in FIG. 1 replacing the conventional DRAM devices with DRAM devices which only need to be refreshed after an extended interval and adapted with a first embodiment of the invention to reduce the power needed to refresh the memory array using a burst refresh mode.

FIG. 4 depicts a memory array 410 very similar to the memory array 110 described in FIG. 1. Identical components shown in FIG. 4 have been provided with the same reference numeral, and explanation of their function and operation will not be repeated in the interest of brevity. The differences between the memory array 110 shown in FIG. 1 and the memory array 410 shown in FIG. 4 are twofold. First, the memory array 410 depicted in FIG. 4 has been adapted to use DRAM memory banks which only need to be refreshed after an extended interval 412 and 414. Second, to employ a first embodiment of the invention and take advantage of the potential power savings afforded by the use of the DRAM memory banks which only need to be refreshed after an extended interval 412 and 414, a delay counter 420 has been added to the memory array 410. The memory array 410 shown in FIG. 4 employs burst refresh, as does memory array 110 in FIG. 1.

The delay counter 420 shown in FIG. 4 is a bit up counter which extends the interval between refresh cycles being conducted in the memory banks 412 and 414, and powers off supporting circuitry when it is not needed. The delay counter 420 extends the interval between refresh cycles by intercepting and counting the refresh signals being generated by the refresh controller 120, the refresh controller 120 being responsive to externally applied refresh signals. The delay counter 420 generates a delayed refresh signal to initiate a refresh cycle only after having counted a large, predetermined number of refresh signals from the refresh controller 120. In effect, the overflow signal of the delay counter 420 becomes the actual refresh signal for the memory array 410.

Figure 5:
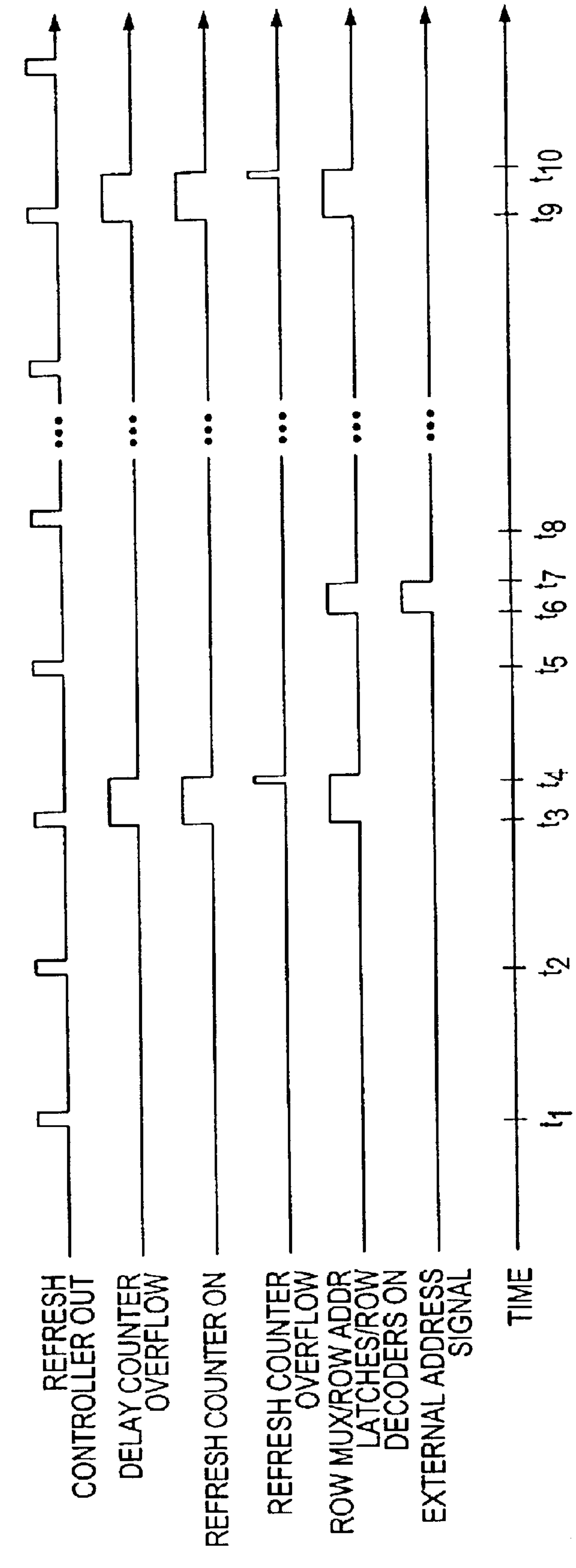
FIG. 5 is a timing diagram of the first embodiment of the invention to reflect the reduction in state changes made possible by the first embodiment of the invention.

FIG. 5 shows how the delay counter 420 receives refresh signals from the refresh controller 120 and periodically generates a delayed refresh signal to trigger a refresh cycle. The refresh controller 120 generates a refresh signal as often as is needed to refresh conventional DRAM memory banks 112 and 114 with which the conventional external circuitry (not shown) was designed to operate. In a conventional DRAM array, each pulse of the refresh controller 120 would trigger a refresh cycle for the entire memory array 410. However, even though the refresh controller 120 issues a refresh signal at intervals $t_1$ through $t_{10}$, the refresh counter 124 and the addressing circuitry 160, including the row multiplexer 130, row address latches 150 and 152, and row decoders 132–142, remain powered off and no refresh cycle is conducted until $t_3$. Instead, for each refresh signal generated by the refresh controller 120, the delay counter 420 is incremented. The delayed refresh signal will be generated only when a desired number of refresh signals generated by the refresh controller 120 have been counted and skipped.

At $t_3$ the delay counter 420 reaches its overflow count and the delay counter 420 overflow signal goes high. As shown in FIG. 5, the overflow signal from the delay counter 420 turns on the refresh counter 124 and the rest of the addressing circuitry 160, including the row multiplexer 130, row address latches 150 and 152, and row decoders 132–142. The refresh counter 124 cycles through all $2^{14}$ or 16,384 row addresses in the memory array 410. Each address is passed to the row address multiplexer 130 which, in turn, directs the generated address to one of two row address latches 150 and 152. The row address latches 150 and 152 supply the row address to one of sixteen row address decoders 132–142 associated with each memory bank 410 and 412.

At the conclusion of the refresh cycle, the overflow bit of the refresh counter 124 goes high as depicted at $t_4$ of FIG. 5. This overflow bit is fed back to the delay counter 420 and resets it. At this point, the delay counter 420 once again begins counting the refresh signals generated by the refresh controller 120, initiating a refresh cycle only after the delay counter 420 again reaches its overflow count. A suitably large delay counter 420 could be used so that the delay counter 420 would only overflow as often as needed to refresh the memory banks 412 and 414 only after an extended interval.

The cells in the memory banks 412 and 414 do not need to be refreshed thousand of times per second as do conventional memory cells, thus, the addressing circuitry 160, including the row multiplexer 130, the row address latches 150 and 152, and the row decoders 132–142, all can be left powered off except as needed. Unneeded refresh signals generated by the refresh controller 120, as shown at $t_1$, $t_2$, $t_5$, and $t_8$ in FIG. 5, can be ignored, and the addressing circuitry left powered off. Power need not be supplied to the addressing circuitry 160 until the delay counter 420 reaches overflow and indicates the addressing circuitry 160 needs to be powered on, as shown at $t_3$ and again at $t_9$. The addressing circuitry 160 can be powered off at the conclusion of each of the refresh cycles, as shown at $t_4$ and $t_{10}$ in FIG. 5.

The addressing circuitry 160 still will be needed to perform memory read or write operations, as signaled by the external address signal 126 as shown at $t_6$. However, because the refresh counter 124 is not needed for a memory read or write operation, the refresh counter 124 can still be left powered off at these times.

The addressing circuitry 160 will be powered on by the delay counter 420 or the external address signal 126. If the power sourced by the overflow signal of the delay counter 420 or external address signal 126 is not sufficient to power the addressing circuitry 160, the overflow signal of the delay counter 420 or the external address signal 126 can be used to enable a transistor having sufficient power-handling capability to power these circuits. Use of a transistor or other device which can supply more power, switched by the output of another circuit, is well known in the art and will not be described here further for the sake of brevity.

Figure 4A:
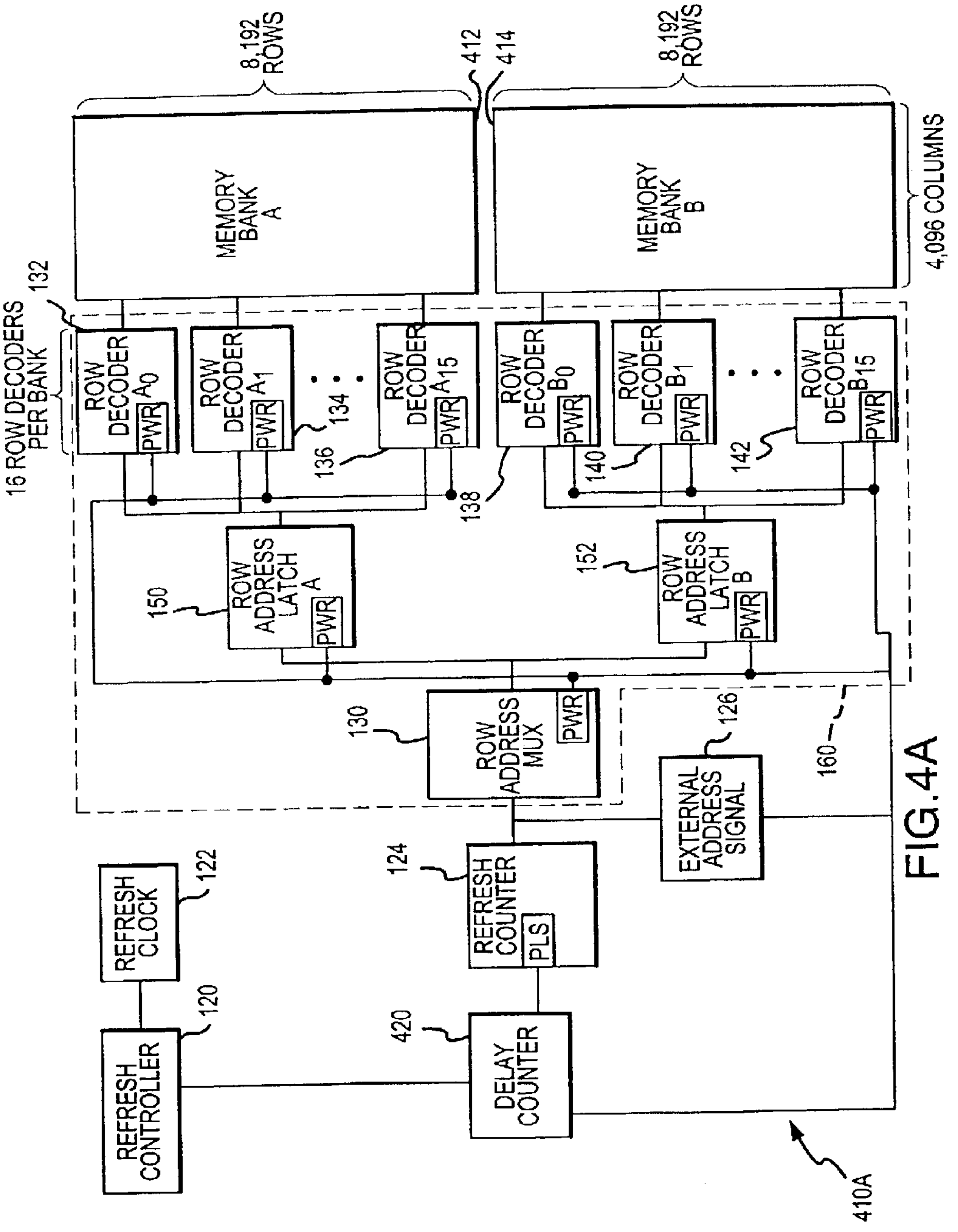
FIG. 4A is a block diagram of the same section of a DRAM memory array depicted in FIG. 1 replacing the conventional DRAM devices with DRAM devices which only need to be refreshed after an extended interval and adapted with a first embodiment of the invention to reduce the power needed to refresh the memory array using a distributed refresh mode.

FIG. 4A depicts a similar memory array 410A adapted to use the first embodiment of the invention in a distributed refresh mode. There are only three differences between the memory array 410A depicted in FIG. 4A and memory array 410 depicted in FIG. 4. First, the refresh counter 124 is pulsed by the delay counter 420 instead of the refresh clock 122. As previously described, when using a distributed refresh mode, each refresh signal issued by the refresh controller 120 causes one single row of the memory banks 412 and 414 to be refreshed at a time instead of all the rows being refreshed in a single sequence. The delay counter 420 will count a large, predetermined number of these signals before initiating the refresh sequence for the next row in the memory array. Also as previously described, because one refresh sequence will be initiated for each of the 8,192 rows in the memory array 410A, the interval between refresh sequences initiated by the delay counter 420 will be 1/8,192 as long as the interval between refresh sequences initiated by the delay counter 420 for the memory array 410. Second, in the memory array 410A the refresh counter 124 is not powered on and off by the delay counter 420. Using distributed refresh, the refresh counter 124 must constantly maintains its row count. Third, in the memory array 410A, an overflow output of the refresh counter 124 is not needed.

No separate timing diagram is included for the embodiment of the invention depicted in FIG. 4A. As will be appreciated in light of the foregoing discussion, the main differences between the timing of operations between the burst and distributed refresh mode embodiments are that the refresh counter 124 always remains on and there is no need for a refresh counter 124 overflow signal. Thus, the plots of these signals in FIG. 5 can be ignored. Just as with the burst mode embodiment, when the delay counter 420 reaches overflow, the addressing circuitry is powered on and the next row in the memory array is refreshed.

In sum, the first embodiment of the invention provides three significant advantages. First, none of the circuitry designed to work with conventional DRAM devices, including the refresh controller 120, refresh clock 122, refresh counter 124, row decoders 132–142, row address latches 150 and 152, and row multiplexer 130 or any external circuitry directing the refresh controller 120, must be redesigned or even altered. The embodiment of FIG. 4 allows the use of conventional refreshing circuitry only by adding the delay counter 420 to control the enabling of the addressing circuitry 160. Second, power consumption is reduced within the memory storage banks 412 and 414 themselves because those banks would not constantly be refreshed. Third, power consumed by the addressing circuitry 160 is reduced because these devices would be powered off when not in use.

Figure 6:
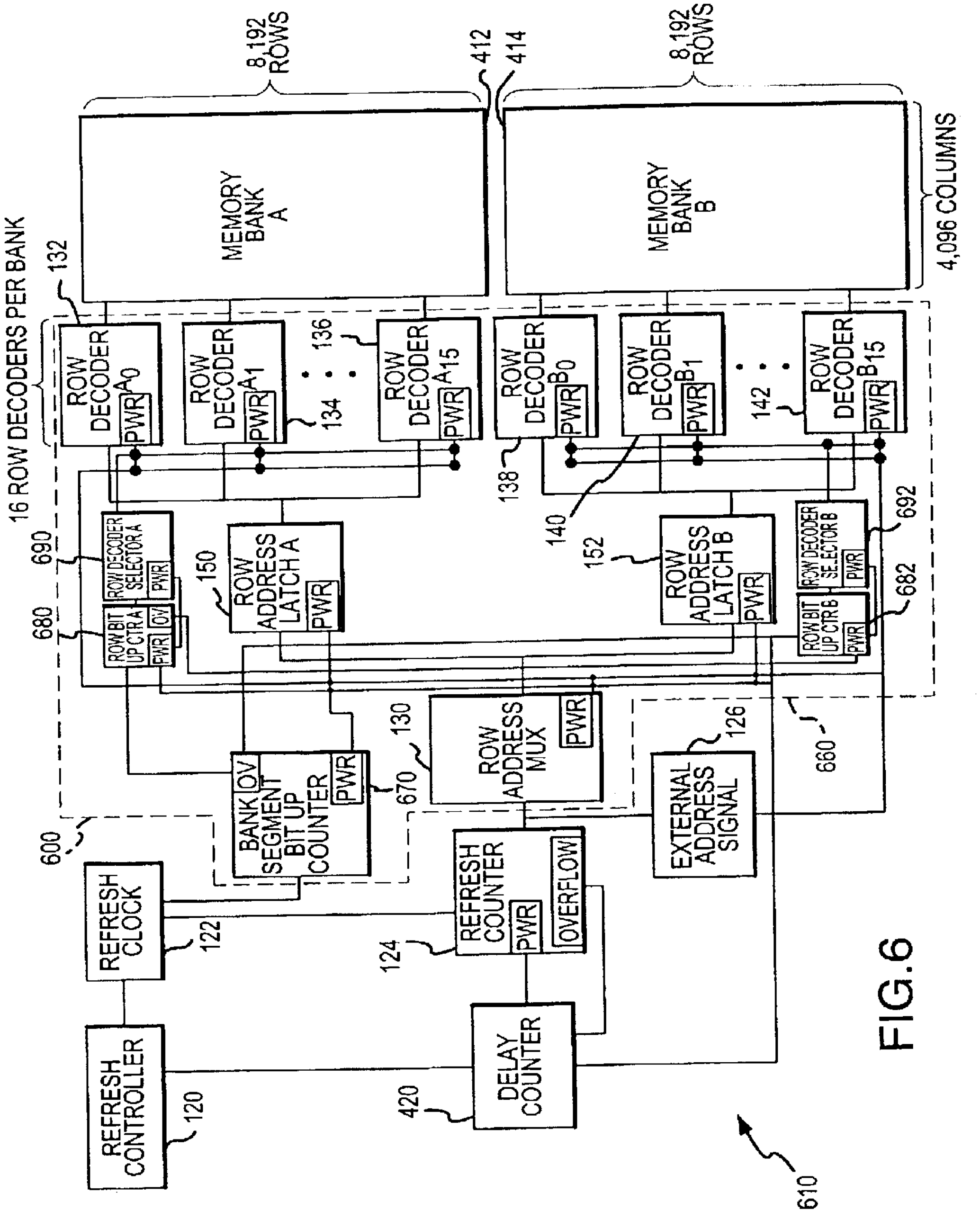
FIG. 6 is a block diagram of the same section of a DRAM memory array depicted in FIG. 4 further adapted with a second embodiment of the invention to save additional power in refreshing the memory array using a burst refresh mode.

A second embodiment of the invention shown in FIG. 6 shows how additional power can be saved by selectively powering on only parts of the addressing circuitry 660 during a refresh cycle. In the first embodiment of the invention, when either the delay counter 420 reaches overflow, all of the addressing circuitry 160 is powered on, regardless of which row of which memory bank 412 or 414 is to be accessed. In other words, whenever the memory banks 412 or 414 are accessed, thirty-five different devices are powered on, including the row address multiplexer 130, two row address latches 150 and 152, and thirty-two row decoders 132–142. Further, considering that the memory array 410 stores just one bit of what presumably is at least an eight-bit word, then at least eight times as many devices would be powered on each time the memory is accessed for a read, write, or refresh operation, even though only one row can be read from, written to, or refreshed at one time.

This second embodiment uses five additional control devices to control addressing of the memory array during refresh cycles, only three of which are powered on at one time when using a burst refresh mode. These additional devices allow for only six supporting devices to be activated at a time during a refresh cycle instead of thirty-five. This saves the wasteful powering and heat generation of twenty-nine superfluous devices. For a memory array eight bits in width, forty-eight devices would only need to be powered on at one time instead of two-hundred and eighty.

FIG. 6 depicts a memory array 610 very similar to the memory array 410 described in FIG. 4. PCDRAM memory banks which only need to be refreshed after an extended interval 412 and 414 still are being used, and to take advantage of their lower volatility, a delay counter 420 again is employed to extend the interval between refresh cycles. Five devices are added to the memory array 610 shown in FIG. 6: a bank segment bit up counter 670, two row bit up counters 680 and 682, and two row decoder selectors 690 and 692. The purpose of these devices is to selectively power on only the row decoder 132–142 that is needed at any one point of a refresh cycle. These row decoders 132–142 constitute thirty-two of the thirty-five devices or 90% of the addressing circuitry 160 (FIGS. 1 and 4) conventionally used to sequentially address a memory array during a refresh cycle.

The sample memory array 610 again includes two memory banks 412 and 414, each of which comprises, for example, 8,196 rows of memory cells. Associated with each of the memory banks 412 and 414 are sixteen row decoders 132–142. Each row decoder addresses 512 rows of a memory bank. To sequentially access each of the row decoders 132–142, a four-bit counter is needed to sequentially generate a code for each of the $2^4$ or sixteen counters. This embodiment of the invention includes two four-bit row bit up counters 680 and 682, one to generate the address of each of the sixteen row decoders 132–142 for each memory bank 412 and 414. Associated with each of the two counters 680 and 682 is a four-bit demultiplexer which serves as a row decoder selector 690 and 692. For each four-bit sequence generated by each of the row bit up counters 680 and 682, these row decoder selectors will activate one bit of a sixteen-bit wide output as is well known in the art. These pairs of additional devices, row bit up counter A 680 and row decoder selector A 690, and row bit up counter B 682 and row bit up decoder B 692, can selectively and sequentially power on each of the sixteen bit row decoders 132–142 for each of their respective memory banks 412 and 414, one row at a time.

Figure 7:
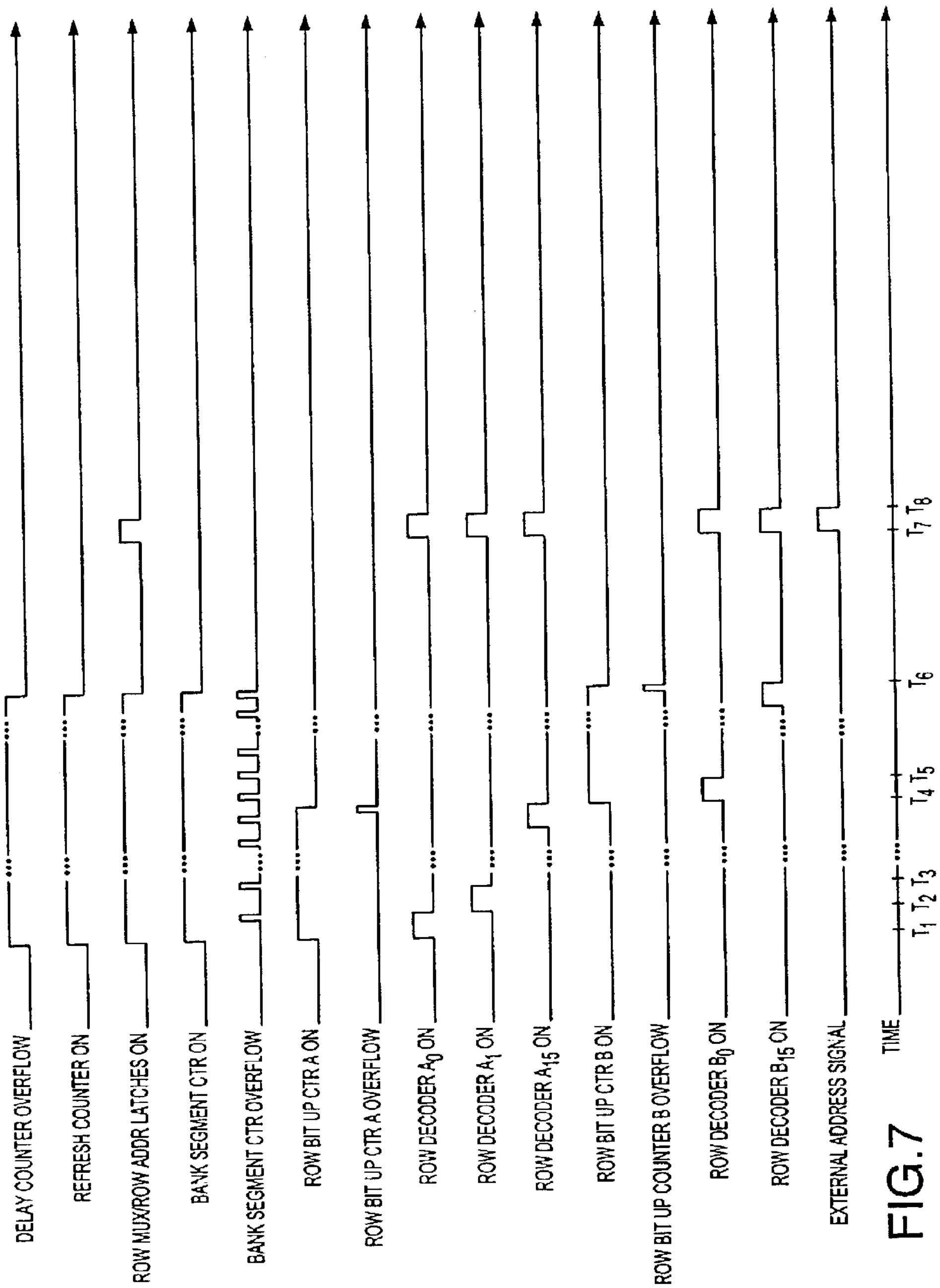
FIG. 7 is a timing diagram of the second embodiment of the invention to reflect the reduction in state changes made possible by the second embodiment of the invention.

FIG. 7 shows how the delay counter 420 receives refresh signals from the refresh controller 120, periodically triggers a refresh cycle, and governs the selective powering on of the addressing circuitry 660. As compared to FIG. 5, which described the operation of the first embodiment of this invention, FIG. 7 details a shorter interval of time to highlight the sequential powering on of the individual row decoders 132–142 during a refresh cycle. Unlike FIG. 5, in FIG. 7 the refresh signals generated by the refresh controller 120 are not shown; it will be appreciated that the refresh controller 120 necessarily continues to generate refresh signals, but depiction of its signal has been eliminated from this figure for the sake of simplicity.

At $t_1$, the delay counter 420 has counted the large, predetermined number of refresh signals generated by the refresh controller 120 to warrant initiating a refresh sequence for the DRAM memory banks which only need to be refreshed after an extended interval 412 and 414. The overflow signal of the delay counter 420 goes high and powers on the refresh counter 124, the row address multiplexer 130, and the row address latches 150 and 152. However, in contrast to the first embodiment of this invention, the overflow signal generated by the delay counter 420 does not power on each of the row decoders 132–142. Instead, this overflow signal powers on row bit up counter A 680, row decoder selector A 690, and the bank segment bit up counter 670. With row bit up counter A 680 powered on in its initial state, it supplies a count of four zeroes to row decoder selector A 690. Row decoder selector A therefore activates row decoder $A_0$ 132. Because it is active, row decoder $A_0$ 132 is able to sequentially address each of the $2^9$ or 512 rows that it addresses in memory bank A 412. These row addresses are supplied to row decoder $A_0$ 132 by row address latch A 150, which has received that address from the row address multiplexer 130. The row address multiplexer 130 has generated this address by decoding the count provided to it by the refresh counter 124.

In this example, the bank segment bit up counter 670 is a nine-bit counter that will reach overflow after counting $2^9$ or 512 pulses of the refresh clock 122. The overflow of the bank segment bit up counter 670 is connected to both the row bit up counters 680 and 682. The overflow signal from the bank segment bit up counter 670 can increment row bit up counters 680 and 682 after every 512 pulses of the refresh clock 122 have enabled the refreshing of each of the 512 rows in the memory bank segment addressed by each of the row decoders 132–142. The same refresh clock 122 pulses the bank segment bit up counter 670 and the refresh counter 124. Thus, the nine-bit count maintained by the bank segment bit up counter 670 and the nine least significant bits of the count maintained by the refresh counter 124 will be synchronized. Because they are synchronized, with the completion of each nine-bit count, the bank segment bit up counter 670 will overflow to increment the appropriate row bit up counter 680 and 682, in turn enabling the appropriate row decoder selector 690 and 692 to activate the appropriate row decoder 132–142, while the refresh counter 124 continues to count the rows it refreshes throughout the memory array 610.

At time $t_2$ the bank segment bit up counter 670 has sequenced through its entire nine-bit sequence and generates an overflow signal. This overflow signal increments row bit up counter A 680. In turn, row decoder selector A 690 generates a different sixteen-bit code which powers off row decoder $A_0$ 132 and powers on row decoder $A_1$ 134. As the bank segment bit up counter 670 again sequences through its nine-bit count, the refresh counter 124 sequences through the nine least significant bits of its count for the second time. This time, however, the nine least significant bits of the count generated by refresh counter 124 are applied through row decoder $A_1$ 134 and serve to address and refresh the next 512 rows of memory bank A 412.

At $t_3$, when the bank segment bit up counter 670 reaches overflow for the second time, row decoder $A_1$ 134 is then powered off while the next row decoder $A_2$ (not shown in FIG. 6) is powered on, while all the other row decoders 132–142 remain powered off. This sequence continues until $t_4$, when the bank segment bit up counter 670 has reached overflow for the sixteenth time. At $t_4$, having counted sixteen overflows of the bank segment bit up counter 670, row bit up counter A 680 reaches overflow. As shown in FIG. 7, this overflow signal powers on row decoder selector B 682 and its associated row decoder selector 692. A simple latch, whose use is well known in the art, could be used to preserve the high overflow signal generated by row bit up counter A 680 to maintain power to row bit up counter B 682 and its associated row decoder selector B 692 while powering off row bit up counter A 680 and row decoder selector A 690.

As was the case with row bit up counter A 680, when it is powered on at $t_4$, row bit up counter B 682 supplies a count of four zeroes to row decoder selector B 692. Row decoder selector B 692 activates row decoder $B_0$ 138. Row decoder $B_0$ 138 then sequentially addresses each of the 512 rows of memory bank A 412 that it serves. These row addresses are supplied to row decoder $B_0$ 138 by row address latch B 152, which has received that address from the row address multiplexer 130. The row address multiplexer 130 has generated this address by decoding the count provided to it by the refresh counter 124.

At $t_5$ the bank segment bit up counter 670 has sequenced through its nine-bit count and reached overflow. This overflow signal causes row bit up counter B 682 to increment, in turn causing row decoder selector B 692 to power off row decoder $B_0$ 138 and activate row decoder $B_1$ 140. Thus, as with the sixteen row decoders 132–136 associated with memory bank A 412, the repeated overflow of the bank segment bit up counter 670 activates one at a time the sixteen address decoders 138–142 associated with memory bank B 414, while each addresses the 512 rows it serves in associated memory bank B 414.

At $t_6$ all sixteen row decoders 132–142 for both memory banks 412 and 414 have been sequentially activated, each row decoder 132–142 has addressed and refreshed all 512 rows it serves, the refresh counter 124 reaches overflow, and the refresh cycle is complete. Overflow of the refresh counter 124, as in the first embodiment, powers off the addressing circuitry 660 and the refresh counter 124. One difference in the second embodiment is that fewer devices in the addressing circuitry 660 will be turned off upon overflow of the refresh counter 124. This is because only a few devices needed to refresh the last 512 rows of memory bank B 414 still will be powered on at the end of the refresh cycle, including the row address multiplexer 130, row address latch A 150, row address latch B 152, row bit up counter B 682, row decoder selector B 692, and row decoder $B_{15}$ 142. These, too, will be powered off upon overflow of the refresh counter 124.

At $t_7$, when an external address signal 126 is received, all the addressing circuitry 660 is powered up. In this embodiment, all of the circuitry is powered up so that each of the memory banks 412 and 414 can be accessed quickly, without the processor or controller generating the external address signal 126 having to wait for the sequential activation of row decoders 132–142 which would slow system processing throughput. The memory access initiated by receipt of the external address signal 126 is completed at $t_8$, and all of the addressing circuitry 660 is powered off.

Figure 6A:
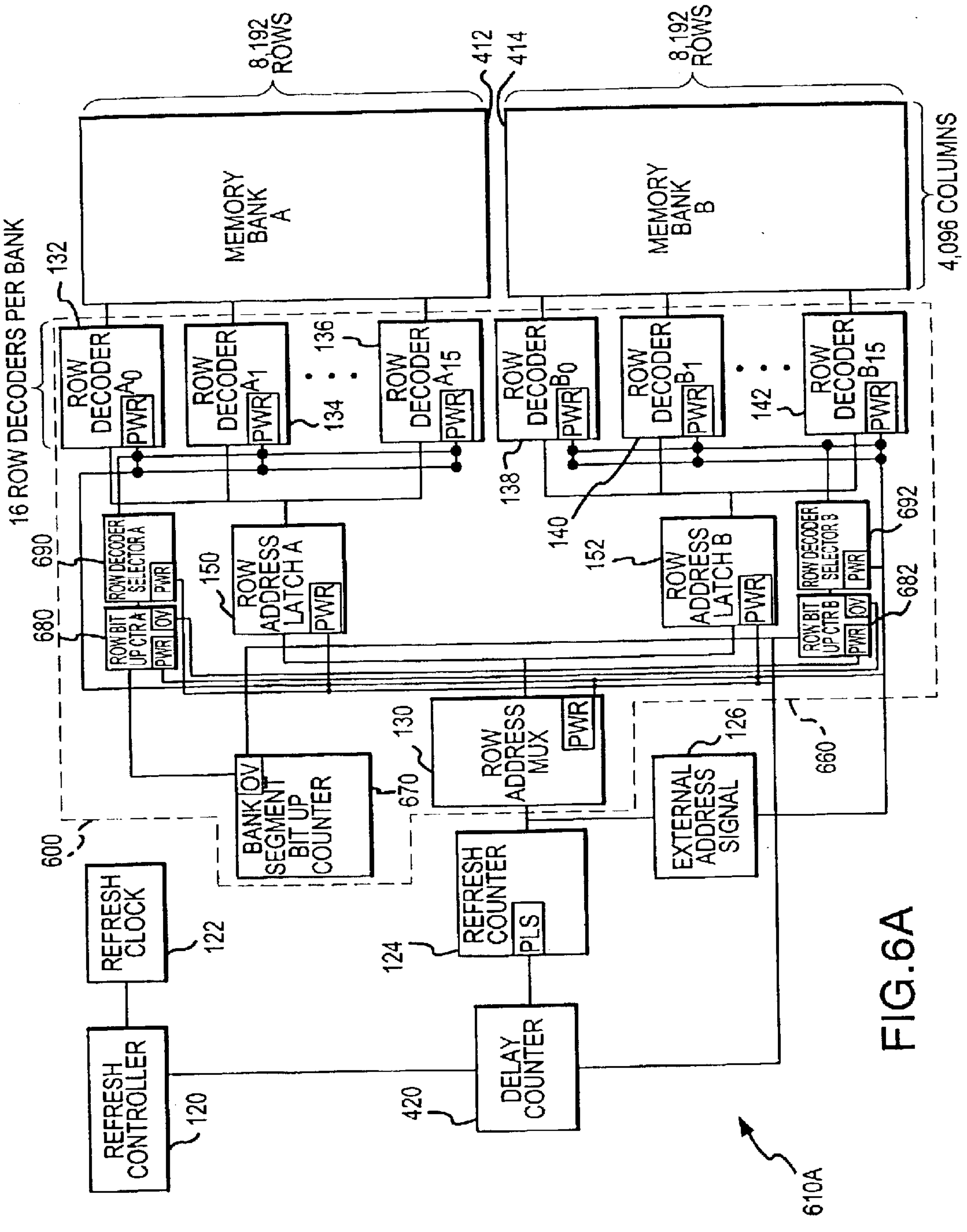
FIG. 6A is a block diagram of the same section of a DRAM memory array depicted in FIG. 4 further adapted with a second embodiment of the invention to save additional power in refreshing the memory array using a distributed refresh mode.

FIG. 6A depicts a similar memory array 610A adapted to use the first embodiment of the invention in a distributed refresh mode. There are only three differences between the memory array 610A depicted in FIG. 6A and memory array 610 depicted in FIG. 6. First, as with the first embodiment of the invention adapted to use distributed refresh, the refresh counter 124 is pulsed by the delay counter 420 instead of the refresh clock 122. Second, in the memory array 610A, the refresh counter 124, the row segment bit up counter 670, and row bit up counter A 680 and row bit up counter B 682 are not powered on and off by the delay counter 420. Using distributed refresh, the refresh counter 124 and the bank segment bit up counter 670 must constantly maintain their row counts. Similarly, at least one of either row bit up counter A 680 or row bit up counter B 682, whichever is currently active, must remain powered on to maintain its count of which of the row decoders 132–142 should be activated when the next row is refreshed. Using latches (not shown), the overflow output of row bit up counter A 680 can be used to power on row bit up counter B 682, and the overflow output of row bit up counter B 682 can be used to power on row bit up counter A 680 so that the one not being used does not need to be powered on at all times. Alternatively, for design simplicity, both row bit up counters 680 and 682 could be left powered on at all times. Accordingly, using distributed refresh mode, three or four additional devices will need to be powered on at all times. Third, in the memory array 410A, an overflow output of the refresh counter 124 is not needed.

No separate timing diagram is included for the embodiment of the invention depicted in FIG. 6A. As will be appreciated in light of the foregoing discussion, the main differences between the timing of operations between the burst and distributed refresh mode embodiments are that the refresh counter 124, the bank segment bit up counter 670, and at least one of the row bit up counters 680 and 682, always remain on, thus the plots of these signals in FIG. 7 can be ignored. As also will be appreciated, when the delay counter 420 reaches overflow, the addressing circuitry 660 will be powered on, one row will be refreshed, and then the addressing circuitry will be powered off until the next delay counter 420 overflow. Just as with the burst mode embodiment, when either of the row bit up counters 680 and 682 reach overflow, it may be powered off and thereby power on its counterpart, or, as previously described, both could remain powered on at all times.

Certainly, the invention also could be embodied in other forms. One example not shown in the figures could be a hybrid form using a series of distributed refresh signals generated by the refresh controller to perform, in essence, a slow burst refresh of the array after the passage of an extended interval. The refresh controller would be programmed to generate row refresh signals after the passage of a suitable interval for a conventional DRAM array. The delay counter would intercept, count, and ignore a number of these distributed refresh signals until the passage of an extended interval by when the less volatile memory devices would have to be refreshed. As with other embodiments, the number of refresh signals from the refresh controller to be ignored would be determined by the duration of the extended interval divided by the duration between refresh signals generated by the refresh controller for a conventional DRAM memory array.

After the extended interval had passed, the delay counter would pass the refresh signals from the refresh controller through to the refresh counter. This could be handled by connecting the overflow signal from the delay counter and the refresh signal from the refresh controller to an AND gate, the output of which would become the input pulse to the refresh controller. After counting a number of refresh signals corresponding to the extended interval causing the delay counter's overflow signal to go high, the refresh signals would cause a high output from the AND gate which, in turn, would pulse the refresh counter. The rows of the less volatile memory array would then be refreshed sequentially as pulsed by the row refresh signals from the refresh controller. In other words, the memory array would be refreshed in one slow, sequential burst in rhythm to the row refresh signals from the refresh controller after the passage of an extended interval. Once all the rows were refreshed, the delay counter would reset, and proceed to ignore another long sequence of row refresh commands from the refresh controller until the less volatile memory array once again needed to be refreshed.

This is just one potential additional embodiment. Other embodiments of the invention also conceivably might be created to exploit the power savings afforded by the use of a delay apparatus to avoid unnecessary refresh cycles.

Figure 8:
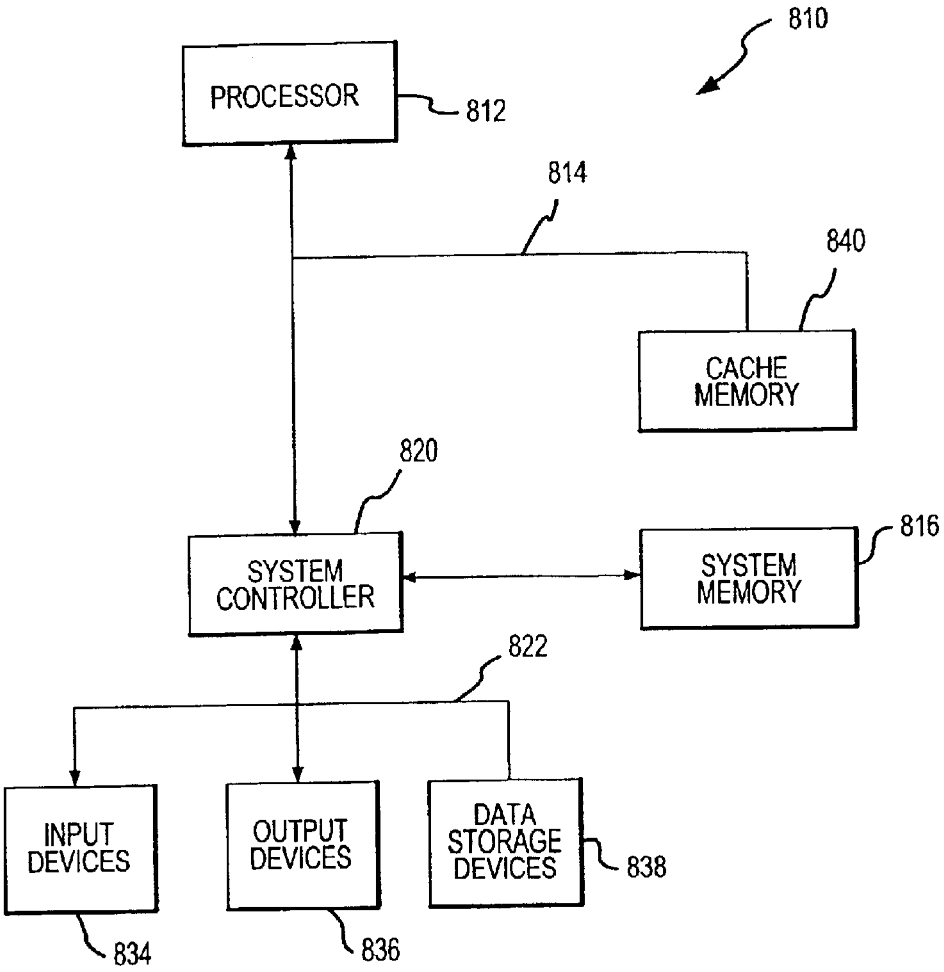
FIG. 8 is a block diagram of a computer system using a memory array employing DRAM devices which only need to be refreshed after an extended interval and a power saving memory device of an embodiment of the invention.

Embodiments of the invention can be incorporated into a computer system by one skilled in the art. FIG. 8 is a block diagram of a computer system 810 that includes a processor 812 for performing various computing functions by executing software to perform specific calculations or tasks. The processor 812 is coupled to a processor bus 814 that normally includes an address bus, a control bus, and a data bus (not separately shown). In addition, the computer system 810 includes a system memory 816, which could be the memory array 410 of FIG. 4 or the memory array 610 of FIG. 6, both of which use DRAM devices which only need to be refreshed after an extended interval, such as PCDRAM devices, and supporting circuitry which enables the power savings previously described. The system memory 816 is coupled to the processor bus 814 by a system controller 820 or similar device, which is also coupled to an expansion bus 822, such as a Peripheral Component Interface ("PCI") bus. A bus 726 coupling the system controller 820 to the system memory 816 also normally includes an address bus, a control bus, and a data bus (not separately shown), although other architectures can be used. For example, the data bus of the system memory 816 may be coupled to the data bus of the processor bus 814, or the system memory 816 may be implemented by a packetized memory (not shown), which normally does not include a separate address bus and control bus.

The computer system 810 also includes one or more input devices 834, such as a keyboard or a mouse, coupled to the processor 812 through the expansion bus 822, the system controller 820, and the processor bus 814. Also typically coupled to the expansion bus 822 are one or more output devices 836, such as a printer or a video terminal. One or more data storage devices 838 are also typically coupled to the expansion bus 822 to allow the processor 812 to store data or retrieve data from internal or external storage media (not shown). Examples of typical storage devices 838 include hard and floppy disks, tape cassettes, and compact disk read-only memories (CD-ROMs). The processor 812 is also typically coupled to cache memory 840 through the processor bus 814.

Figure 2A:
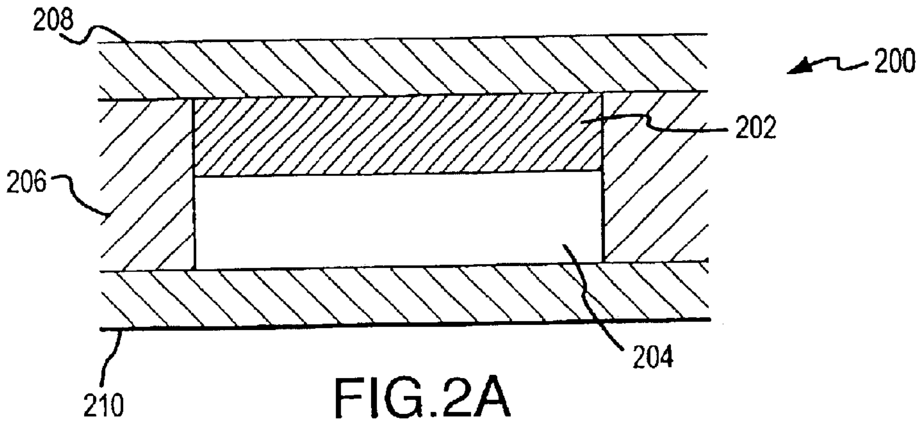
FIG. 2A is a cross-sectional view of a known programmable conductor DRAM (PCDRAM) memory cell in its initial state before the application of a voltage that can be used to write to the cell that may be used with the invention.
Figure 2B:
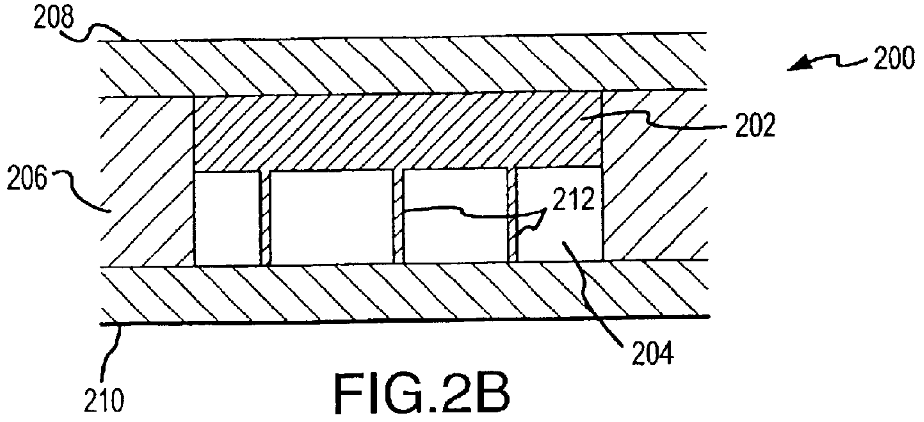
FIG. 2B is a cross-sectional view of the PCDRAM cell depicted in FIG. 2A after a high voltage has been applied to the cell to write a logical one to the cell.
Figure 2C:
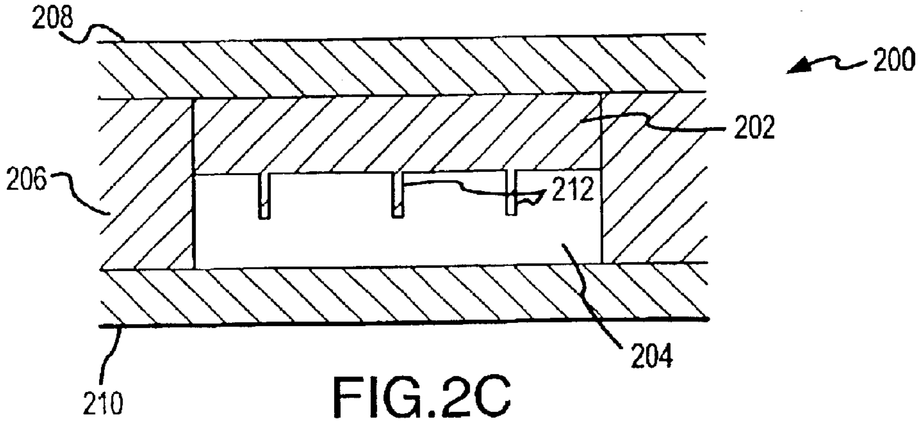
FIG. 2C is a cross-sectional view of the PCDRAM cell depicted in FIG. 2B after a high voltage of polarity opposite to that applied to cause the state depicted in FIG. 2B has been applied to the cell to write a logical zero to the cell.

It should be noted that, unlike conventional DRAM devices 112 and 114, PCDRAM devices also must be signaled as to when they are being refreshed as opposed to merely being read. The reason for this, as was previously described, is one of the inherent differences between conventional DRAM devices and PCDRAM devices. In a conventional DRAM memory cell, reading a memory cell through an associated sense amplifier simultaneously and automatically refreshes that cell. Accordingly, presented with a row address, a conventional DRAM device will read the cells in that row, and, coincidentally, refresh the cells in that row. By contrast, a PCDRAM device cannot be refreshed simply by reading it. A higher voltage than carried by read signals in the device must be applied to cause the formation or reformation of dendrils 212 (FIG. 2B). Thus, the memory banks 412 and 414 must be signaled that this is not an ordinary read signal, but that the addresses in that row must be read and refreshed with the application of a higher voltage, as previously described.

One also should note that PCDRAM devices themselves can be powered off when not being accessed. PCDRAM devices store their data bits by undergoing a physical transformation as previously described. Thus, they can be turned off when not in use. In the first embodiment of the invention, memory bank A 412 and memory bank B 414 could be powered on and off by the same delay counter 420 overflow signal that powered on the addressing circuitry 160. In the second embodiment of the invention, memory bank A 412 could be powered on by the same delay counter 420 overflow signal that powers on row bit up decoder A 680 and row decoder selector A 690, and powered off by the same row bit up counter A 680 overflow signal that powers off row bit up decoder A 680 and row decoder selector A 690. Similarly, memory bank B 414 could be powered on by the same row bit up counter A 680 overflow signal that powers on row bit up decoder B 682 and row decoder selector B 692, and powered off by the same refresh counter 124 overflow signal that powers off row bit up decoder B 682 and row decoder selector B 692.

In sum, the first embodiment of the invention saves power by extending the time between refresh cycles to exploit less volatile DRAM devices which need to be refreshed only after an extended interval. The first embodiment accomplishes this predominantly through the use of a delay counter which delays the refresh signals generated by a conventional refresh controller designed for conventional DRAM memory devices, and generates refresh signals much less frequently. The second embodiment of the invention further saves power during each refresh cycle by sequentially activating only the row decoders needed to address the rows currently being refreshed rather than powering on all the row decoders at once.

It is to be understood that, even though various embodiments and advantages of the present invention have been set forth in the foregoing description, the above disclosure is illustrative only. Changes may be made in detail, and yet remain within the broad principles of the invention.

What is claimed is:

1. A memory device having circuitry to refresh its memory cells, and being responsive to external refresh commands and an external address signal, comprising:

an array of memory cells that must be periodically refreshed after a refresh interval;

an addressing system operably connected to the array of memory cells, the addressing system responsive to an address signal by accessing memory cells in the array corresponding to row address signal;

a refresh controller generating a refresh signal;

a refresh counter operably connected to the addressing system, the refresh counter being operable to generate the address signal in response to a delayed refresh signal; and a delay counter operably connected to the addressing system, the refresh controller, and the refresh counter, the delay counter generating the delayed refresh signal causing the memory cells in the array to be refreshed, the delay counter measuring the refresh interval by counting a number of the refresh signals received from the refresh controller.

2. The memory device of claim 1 wherein the memory device is operable to remove power from the addressing system when an address signal is not being received from the refresh counter or the external address signal, the memory device further being operable to apply power to the addressing system when an address signal is received from the refresh counter or the external address signal.

3. The memory device of claim 2 wherein the delay counter is operable to remove power from and apply power to the addressing system.

4. The memory device of claim 1 wherein the addressing system is comprised of a series of addressing subsystems operably connected to the array of memory cells, and each one of the addressing subsystems addresses a subsection of memory cells.

5. The memory device of claim 4 wherein each of the addressing subsystems is individually powered on and off.

6. The memory device of claim 5, wherein each of the addressing subsystems is powered on when the address signal received by the addressing system falls within the subsection the addressing subsystem addresses, and powered off when the address signal received by the addressing system does not fall within the subsection the addressing subsection addresses.

7. The memory device of claim 6 further comprising a subsystem selector operably connected to the addressing subsystems and the addressing system, the subsystem selector being operable to selectively power on and off the addressing subsystems.

8. The memory device of claim 7 wherein the subsystem selector further comprises a subsystem counter generating a count which causes the subsystem selector to power on and off the addressing subsystems.

9. The memory device of claim 1 wherein the memory cells are comprised of programmable conductor dynamic random access memory cells.

10. The memory device of claim 1 wherein the array of memory cells are powered off when no address signal is being received from the refresh counter or the external address signal, and powered on when an address signal is being received from the refresh counter or the external address signal.

11. The memory device of claim 1 wherein the memory cells in the array are refreshed in a burst refresh mode.

12. The memory device of claim 1 wherein the memory cells in the array are refreshed in a distributed refresh mode.

13. The memory device of claim 1 wherein the memory cells in the array are arranged in rows and columns, and wherein the memory cells are refreshed on a row-by-row basis.

14. A memory device having an array of memory cells and circuitry to refresh the memory cells, the memory device being responsive to external refresh signals and an external address signal, the memory device comprising:

an array of memory cells that must be periodically refreshed after arefresh interval;

an addressing system operably connected to the array, the addressing system being responsive to an address signal by accessing memory cells in the array corresponding to the address signal;

a refresh controller generating a refresh signal;

a refresh counter operably connected to the addressing system, the refresh counter generating the address signal in response to a delayed refresh signal; and a refresh delay device operably connected to the addressing system, the refresh controller, and the refresh counter, the refresh delay device generating the delayed refresh signal causing the memory cells in the array to be refreshed after the refresh interval has passed.

15. The memory device of claim 14 wherein the refresh delay device determines the refresh interval based on a number of the refresh signals received from the refresh controller.

16. The memory device of claim 14 wherein the addressing system is operable to be powered off when no address signal is being received from the refresh counter or the external address signal, and powered on when an address signal is being received from the refresh counter or the external address signal.

17. The memory device of claim 16 wherein the addressing system is powered off and on by the refresh delay device.

18. The memory device of claim 14 wherein the addressing system is comprised of a series of addressing subsystems, and each of the addressing subsystems is coupled to and addresses a respective array subsection.

19. The memory device of claim 18 wherein the addressing subsystems are individually powered on and off.

20. The memory device of claim 19 wherein each of the addressing subsystems is powered on when the address signal received by the row addressing system falls within the array subsection the addressing subsystem addresses, and powered off when the address signal received by the addressing system does not fall within the array subsection the addressing subsection addresses.

21. The memory device of claim 19 further comprising a subsystem selector operably connected to the addressing subsystems and the addressing system, the subsystem selector being operable to selectively power on and off the addressing subsystems.

22. The memory device of claim 21 wherein the subsystem selector further comprises a subsystem counter generating a count causing the subsystem selector to power on and off the addressing subsystems.

23. The memory device of claim 14 wherein the memory cells are comprised of programmable conductor dynamic random access memory cells.

24. The memory device of claim 14 wherein the array of memory cells is powered off when no address signal is being received from the refresh counter or the external address signal, and powered on when an address signal is being received from the refresh counter or the external address signal.

25. The memory device of claim 14 wherein the memory cells in the array are refreshed in a burst refresh mode.

26. The memory device of claim 14 wherein the memory cells in the array are refreshed in a distributed refresh mode.

27. The memory device of claim 14 wherein the memory cells in the array are arranged in rows and columns, and wherein the memory cells are refreshed on a row-by-row basis.

28. A refresh device for an array of memory cells that must be periodically refreshed after a refresh interval, the array being responsive to external refresh commands and an external address signal, the array being operably connected to an addressing system responsive to an address signal by accessing memory cells in the array corresponding to the address signal, a refresh controller generating a refresh signal, and a refresh counter operably connected to the addressing system, the refresh counter generating the address signal in response to a delayed refresh signal, the refresh device comprising:

a delay counter operably connected to the addressing system, the refresh controller, and the refresh counter, the delay counter generating the delayed refresh signal causing the memory cells in the array to be refreshed after the refresh interval has passed, the delay counter measuring the refresh interval by counting a number of the refresh signals received from the refresh controller.

29. The refresh device of claim 28 wherein the addressing system is powered off when no address signal is being received from the refresh counter or the external address signal, and powered on when an address signal is being received from the refresh counter or the external address signal.

30. The refresh device of claim 29 wherein the addressing system is powered off and on by the delay counter.

31. The refresh device of claim 28, wherein the addressing system is comprised of a series of addressing subsystems, each of the addressing subsystems being coupled to and addressing a respective array subsection.

32. The refresh device of claim 31 wherein each of the addressing subsystems is individually powered on and off.

33. The refresh device of claim 32 wherein each of the addressing subsystems is powered on when the address signal received by the addressing system falls within the array subsection the addressing subsystem addresses, and powered off when the address signal received by the addressing system does not fall within the array subsection the addressing subsection addresses.

34. The refresh device of claim 31 further comprising a subsystem selector operably connected to the addressing subsystems and the addressing system, the subsystem selector being operable to selectively power on and off the addressing subsystems.

35. The refresh device of claim 34 wherein the subsystem selector further comprises a subsystem counter generating a count causing the subsystem selector to power on and off the addressing subsystems.

36. The refresh device of claim 28 wherein the array is powered off when no address signal is being received from the refresh counter or the external address signal, and powered on when an address signal is being received from the refresh counter or the external address signal.

37. The refresh device of claim 28 wherein the memory cells in the array are refreshed in a burst refresh mode.

38. The refresh device of claim 28 wherein the memory cells in the array are refreshed in a distributed refresh mode.

39. A refresh device for an array of memory cells that must be refreshed after a refresh interval, the array being responsive to external refresh commands and an external address signal, the array being operably connected to an addressing system that is responsive to an address signal by accessing memory cells in the array corresponding to the address signal, a refresh controller generating a refresh signal, and a refresh counter operably connected to the addressing system, the refresh counter generating the address signal in response to a delayed refresh signal, the refresh device comprising:

a refresh delay device operably connected to the addressing system, the refresh controller, and the refresh counter, the refresh delay device generating the delayed refresh signal causing the memory cells in the array to be refreshed after the refresh interval has passed.

40. The DRAM refresh device of claim 39 wherein the refresh delay device determines the refresh interval on the basis of a number of the refresh signals received from the refresh controller.

41. The refresh device of claim 39 wherein the addressing system is powered off when no address signal is being received from the refresh counter or the external address signal, and powered on when an address signal is being received from the refresh counter or the external address signal.

42. The refresh device of claim 41, wherein the addressing system is powered off and on by the refresh delay device.

43. The refresh device of claim 39 wherein the addressing system is comprised of a series of addressing subsystems each of which is operably connected to and addresses a respective one of the array subsections.

44. The refresh device of claim 43 wherein the addressing subsystems are individually powered on and off.

45. The refresh device of claim 44 wherein each of the addressing subsystems is powered on when the address signal received by the addressing system falls within the array subsection the addressing subsystem addresses, and powered off when the address signal received by the addressing system does not fall within the array subsection the addressing subsystem addresses.

46. The refresh device of claim 44 further comprising a subsystem selector operably connected to the addressing subsystems and the addressing system, the subsystem selector being operable to selectively power on and off the addressing subsystems.

47. The refresh device of claim 46 wherein the subsystem selector further comprises a subsystem counter generating a count causing the subsystem selector to power on and off the addressing subsystems.

48. The refresh device of claim 39 wherein the memory cells in the array are refreshed in a burst refresh mode.

49. The refresh device of claim 39 wherein the memory cells in the array are refreshed in a distributed refresh mode.

50. A refresh means for an array of memory cells that must be refreshed after a refresh interval, the array being responsive to external refresh commands and an external address signal, the array being operably connected to addressing means responsive to an address signal by accessing memory cells in the array corresponding to the address signal, a refresh control means generating a refresh signal, and a refresh counting means operably connected to the addressing means, the refresh counting means generating the address signal in response to a delayed refresh signal, comprising:

delay counting means connected to the addressing means, the refresh control means, and the refresh counting means, the delay counting means generating the delayed refresh signal causing the memory cells in the array to be refreshed after the refresh interval has passed, the delay counting means measuring the refresh interval by counting a number of the refresh signals received from the refresh control means.

51. The refresh means of claim 50 wherein the addressing means is powered off when no address signal is being received from the refresh counting means or the external address signal, and powered on when an address signal is being received from the refresh counting means or the external address signal.

52. There fresh means of claim 50 wherein the addressing means is powered off and on by the delay counting means.

53. The refresh means of claim 50 wherein the addressing means is comprised of a plurality of addressing subsystem means operably connected to and addressing a respective array subsection.

54. The refresh means of claim 53 wherein the addressing subsystem means is individually powered on and off.

55. The refresh means of claim 54 wherein each of the addressing subsystem means is powered on when the address signal received by the addressing means falls within the array subsection the addressing subsystem means addresses, and powered off when the address signal received by the addressing means does not fall within the array subsection the addressing subsection means addresses.

56. The refresh means of claim 53 further comprising a subsystem selection means operably connected to the addressing subsystem means and the addressing means, the subsystem selection means being operable to selectively power on and off the addressing subsystem means.

57. The refresh means of claim 56 wherein the subsystem selection means further comprises subsystem counting means generating a count which causing the subsystem selection means to power on and off the addressing subsystem means.

58. The refresh means of claim 50 wherein the array is powered off when no address signal is being received from the refresh counting means or the external address signal, and powered on when an address signal is being received from the refresh counting means or the external address signal.

59. The refresh means of claim 50 wherein the memory cells in the array are refreshed in a burst refresh mode.

60. The refresh means of claim 50 wherein the memory cells in the array are refreshed in a distributed refresh mode.

61. A refresh means for an array of memory cells that must be refreshed after a refresh interval, the array being responsive to external refresh commands and an external address signal, the array being operably connected to addressing means responsive to an address signal by accessing memory cells in the array corresponding to the address signal, a refresh control means generating a refresh signal, and refresh counting means operably connected to the addressing means, the refresh counting means generating the address signal in response to a delayed refresh signal, the refresh means comprising:

refresh delay means connected to the addressing means, the refresh control means, and the refresh counting means, the refresh delay means generating the delayed refresh signal causing the memory cells in the array to be refreshed after the refresh interval has passed.

62. The refresh means of claim 61 wherein the refresh delay means determines the refresh interval based on a number of the refresh signals received from the refresh control means.

63. The refresh means of claim 61 wherein the addressing means is powered off when no row address signal is being received from the refresh counting means or the external address signal, and powered on when an address signal is being received from the refresh counting means or the external address signal.

64. The refresh means of claim 61 wherein the addressing means is powered off and on by the refresh delay means.

65. The refresh means of claim 61 wherein the row addressing means is comprised of a plurality of addressing subsystem means operably connected to and addressing a respective array subsection.

66. The refresh means of claim 65 wherein the addressing subsystem means are individually powered on and off.

67. The refresh means of claim 66 wherein each of the addressing subsystem means is powered on when the address signal received by the addressing means falls within the array subsection the addressing subsystem means addresses, and powered off when the address signal received by the addressing means does not fall within the array subsection the addressing subsystem means addresses.

68. The refresh means of claim 65 further comprising subsystem selection means operably connected to the addressing subsystem means and the addressing means, the subsystem selection means being operable to selectively power on and off the addressing subsystem means.

69. The refresh means of claim 68 wherein the subsystem selection means further comprises subsystem counting means generating a count causing the subsystem selection means to power on and off the addressing subsystem means.

70. The refresh means of claim 61 wherein the memory cells in the array are refreshed in a burst refresh mode.

71. The refresh means of claim 61 wherein the memory cells in the array are refreshed in a distributed refresh mode.

72. The memory device of claim 14 wherein the memory cells in the array are arranged in rows and columns, and wherein the memory cells are refreshed on a row-by-row basis.

73. A processor-based system, comprising:

a processor;

an input device, operably connected to the processor, allowing data to be entered into the computer system;

an output device, operably connected to the processor, allowing data to be output from the computer system; and a system memory operably connected to the processor, the system memory comprising:

an array of memory cells that must be periodically refreshed after at a refresh interval;

an addressing system operably connected to the array, the addressing system being responsive to an address signal by accessing memory cells in the array corresponding to the address signal;

a data path coupled to an external data terminal of the system memory;

a refresh controller generating a refresh signal;

a refresh counter operably connected to the addressing system, the refresh counter being operable to generate the address of the memory cells in the array in response to a delayed refresh signal; and a delay counter operably connected to the addressing system, the refresh controller, and the refresh counter, the delay counter generating the delayed refresh signal causing the memory cells in the array to be refreshed at the refresh intervals, the delay counter determining the refresh interval by counting a number of the refresh signals received from the refresh controller.

74. The processor-based system of claim 73 wherein the addressing system is powered off when no address signal is being received from the refresh counter or the external address signal, and powered on when a address signal is received from the refresh counter or the external address signal.

75. The processor-based system of claim 74 wherein the addressing system is powered off and on by the delay counter.

76. The processor-based system of claim 73 wherein the addressing system is comprised of a plurality of addressing subsystems operably connected to and addressing respective array subsections.

77. The processor-based system of claim 76 wherein the addressing subsystems are individually powered on and off.

78. The processor-based system of claim 77 wherein each of the addressing subsystems is powered on when the address signal received by the addressing system falls within the array subsection the addressing subsystem addresses, and powered off when the address signal received by the addressing system does not fall within the array subsection the addressing subsection addresses.

79. The processor-based system of claim 78 further comprising a subsystem selector operably connected to the addressing subsystems and the addressing system, the row subsystem selector being operable to selectively power on and off the addressing subsystems.

80. The processor-based system of claim 79 wherein the subsystem selector further comprises a subsystem counter generating a count causing the subsystem selector to power on and off the addressing subsystems.

81. The processor-based system of claim 73 wherein the memory cells are comprised of programmable conductor dynamic random access memory cells.

82. The processor-based system of claim 73 wherein the array of memory cells is powered off when no address signal is being received from the refresh counter or the external address signal, and powered on when an address signal is being received from the refresh counter or the external address signal.

83. The processor-based system of claim 73 wherein the memory cells in the array are refreshed in a burst refresh mode.

84. The processor-based system of claim 73 wherein the memory cells in the array are refreshed in a distributed refresh mode.

85. The processor-based system of claim 14 wherein the memory cells in the array are arranged in rows and columns, and wherein the memory cells are refreshed on a row-by-row basis.

86. A processor-based system, comprising:

a processor;

an input device, operably connected to the processor, allowing data to be entered into the computer system;

an output device, operably connected to the processor, allowing data to be output from the computer system; and a system memory operably connected to the processor, comprising:

an array of memory cells that must be periodically refreshed at a refresh interval;

a addressing system operably connected to the array, the addressing system responsive to an address signal by accessing memory cells in the array corresponding to the address signal;

a data path coupled to an external data terminal of the memory device;

a refresh controller generating a refresh signal;

a refresh counter operably connected to the addressing system, the refresh counter generating the address of memory cells in the array in response to a delayed refresh signal; and a refresh delay device operably connected to the addressing system, the refresh controller, and the refresh counter, the refresh delay device generating the delayed refresh signal causing the rows of memory cells in the array to be refreshed at the refresh interval.

87. The processor-based system of claim 86 wherein the refresh delay device measures the extended interval as a number of the refresh signals received from the refresh controller.

88. The processor-based system of claim 86 wherein the addressing system is powered off when no address signal is being received from the refresh counter or the external address signal, and powered on when an address signal is being received from the refresh counter or the external address signal.

89. The processor-based system of claim 88 wherein the addressing system is powered off and on by the refresh delay device.

90. The processor-based system of claim 86 wherein the addressing system is comprised of a plurality of addressing subsystems operably connected to and addressing respective array subsections.

91. The processor-based system of claim 90 wherein the addressing subsystems are individually powered on and off.

92. The processor-based system of claim 91 wherein each of the addressing subsystems is powered on when the address signal received by the addressing system falls within the array subsection the addressing subsystem addresses, and powered off when the address signal received by the addressing system does not fall within the array subsection the addressing subsection addresses.

93. The processor-based system of claim 90 further comprising a subsystem selector operably connected to the addressing subsystems and the addressing system, the subsystem selector being operable to selectively power on and off the addressing subsystems.

94. The processor-based system of claim 93 wherein the subsystem selector further comprises a subsystem counter generating a count causing the subsystem selector to power on and off the addressing subsystems.

95. The processor-based system of claim 86 wherein the memory cells are comprised of programmable conductor dynamic random access memory cells.

96. The processor-based system of claim 86 wherein the array of memory cells is powered off when no address signal is being received from the refresh counter or the external address signal, and powered on when an address signal is being received from the refresh counter or the external address signal.

97. The processor-based system of claim 86 wherein the memory cells in the array are refreshed in a burst refresh mode.

98. The processor-based system of claim 86 wherein the memory cells in the array are refreshed in a distributed refresh mode.

99. The processor-based system of claim 86 wherein the memory cells in the array are arranged in rows and columns, and wherein the memory cells are refreshed on a row-by-row basis.

100. A system memory having memory cells and being responsive to external refresh signals and an external address signal, the system comprising:

a memory array comprised of rows of PCmemory cells that must be refreshed within a refresh interval;

an addressing system operably connected to the memory array, the addressing system being responsive to an address signal by accessing memory cells in the memory array corresponding to the address signal;

a refresh controller generating a refresh signal;

a refresh counter operably connected to the addressing system and generating the address signals of PCmemory cells in the memory array m response to a refresh command; and a delay counter operably connected to the addressing system, the refresh controller, and the refresh counter, the delay counter generating the delayed refresh signal causing the PCmemory cells in the memory array to be refreshed at refresh interval, the delay counter determining the refresh interval by counting a number of the refresh signals received from the refresh controller.

101. The system memory of claim 100 wherein the addressing system is powered off when no address signal is being received from the refresh counter or the external address signal, and powered on when an address signal is received from the refresh counter or the external address signal.

102. The system memory of claim 101 wherein the addressing system is powered off and on by the delay counter.

103. The system memory of claim 100 wherein the addressing system is comprised of a plurality of addressing subsystems operably connected to the memory array, each of the addressing subsystems addressing a subsection of the memory array.

104. The system memory of claim 103 wherein the addressing subsystems are individually powered on and off.

105. The system memory of claim 104 wherein each of the addressing subsystems is powered on when the address signal received by the addressing system falls within the memory may subsection the addressing subsystem addresses, and powered off when the address signal received by the addressing system does not fall within the memory array subsection the addressing subsection addresses.

106. The system memory of claim 103 further comprising a subsystem selector operably connected to the addressing subsystems and the addressing system, the subsystem selector being operable to selectively power on and off the addressing subsystems.

107. The system memory of claim 106 wherein the subsystem selector further comprises a subsystem counter generating a count causing the subsystem selector to power on and off the addressing subsystems.

108. The system memory of claim 100 wherein the may is powered off when no address signal is being received from the refresh counter or the external address signal, and powered on when a address signal is received from the refresh counter or the external address signal.

109. The system memory of claim 100 wherein the PCmemory cells comprising the memory may are refreshed in a burst refresh mode.

110. The system memory of claim 100 wherein the PCmemory cells comprising the memory may are refreshed in a distributed refresh mode.

111. The memory device of claim 100 wherein the PCmemory cells are arranged in rows and columns, and wherein the PCmemory cells are refreshed on a row-by-row basis.

112. A system memory responsive to external refresh signals and external address signals, the system memory comprising:

a memory array comprised of PCmemory cells that must be refreshed within a refresh interval;

an addressing system operably connected to the memory array, the addressing system being responsive to an address signal by accessing memory cells in the memory array corresponding to the address signal;

a refresh controller generating a refresh signal;

a refresh counter operably connected to the addressing system, the refresh counter generating the address signal of the PC memory cells in the memory array in response to a delayed refresh signal; and a refresh delay device operably connected to the addressing system, the refresh controller, and the refresh counter, the refresh delay device generating the delayed refresh signal causing the PCmemory cells in the memory array to be refreshed within the extended refresh interval.

113. The system memory of claim 112 wherein the refresh delay device determines the refresh interval on the basis of a number of the refresh signals received from the refresh controller.

114. The system memory of claim 112 wherein the addressing system is powered off when no address signal is being received from the refresh counter or the external address signal, and powered on when an address signal is being received from the refresh counter or the external address signal.

115. The system memory of claim 114 wherein the addressing system is powered off and on by the refresh delay device.

116. The system memory of claim 112 wherein the addressing system is comprised of a plurality of addressing subsystems operably connected to the memory array, each of the addressing subsystems being operable to addresses a memory array subsection.

117. The system memory of claim 116 wherein the addressing subsystems are individually powered on and off.

118. The system memory of claim 117 wherein each of the addressing subsystems is powered on when the address signal received by the addressing system falls within the memory array subsection the addressing subsystem addresses, and powered off when the address signal received by the addressing system does not fall within the memory array subsection the addressing subsection addresses.

119. The system memory of claim 118 further comprising a subsystem selector operably connected to the addressing subsystems and the addressing system, the subsystem selector being operable to selectively power on and off the addressing subsystems.

120. The system memory of claim 119 wherein the subsystem selector further comprises a subsystem counter generating a count causing the subsystem selector to power on and off the addressing subsystems.

121. The system memory of claim 120 wherein the array is powered off when no address signal is being received from the refresh counter or the external address signal, and powered on when an address signal is received from the refresh counter or the external address signal.

122. The system memory of claim 112 wherein the rows of PCmemory cells in the memory array are refreshed in a burst refresh mode.

123. The system memory of claim 112 wherein the rows of PCmemory cells in the memory array are refreshed in a distributed refresh mode.

124. A method for refreshing a memory device having an array comprised of memory cells that must be refreshed at a refresh interval, an addressing system operably connected to the array, the addressing system responsive to an address signal by accessing memory cells in the array corresponding to the address signal, a refresh controller generating a refresh signal, a refresh counter operably connected to the addressing system generating the address signal in response to a delayed refresh signal, the method comprising:

counting a predetermined number of the refresh signals from the refresh controller without initiating a refresh cycle; and initiating a refresh signal after the refresh interval has passed, the refresh interval being determined by the counting of the predetermined number of refresh signals from the refresh controller.

125. The method of claim 124 further comprising powering off the addressing system when no address signal is being received.

126. The method of claim 125 wherein the act of powering off the addressing system when no address signal is being received comprises selectively powering off portions of the addressing system that are not being used to address memory cells corresponding to the address signal.

127. The method of claim 126 further comprising determining portions of the addressing system that are being used to address the memory cells corresponding to the address signal and powering off the remaining portions of the addressing system.

128. The method of claim 127 wherein the memory cells in the array are refreshed in a burst refresh mode.

129. The method of claim 127 wherein the memory cells in the array are refreshed in a distributed refresh mode.

130. A method for refreshing a memory device having an array comprised of memory cells that must be refreshed at a refresh interval, an addressing system operably connected to the array, the addressing system responsive to an address signal by accessing memory cells in the array corresponding to the address signal, a refresh controller generating a refresh signal, a refresh counter operably connected to the addressing system generating the address signal of the memory cells in the array in response to a delayed refresh signal, the method comprising:

receiving the refresh signals from the refresh controller;

ignoring a plurality of the refresh signals sequentially received from the refresh controller, the ignored refresh signal extending over a period that is at least as long as the refresh interval; and refreshing at least some of the memory cells responsive to receiving a refresh signal that is not ignored.

131. The method of claim 130 wherein the refresh interval is measured as a number of the refresh signals received from the refresh controller.

132. The method of claim 130 further comprising powering off the addressing system when no address signal is being received.

133. The method of claim 132 wherein the act of powering off the addressing system when no address signal is being received comprises selectively powering off portions of the addressing system that are not being used to address memory cells corresponding to the address signal.

134. The method of claim 133 wherein the act of selectively powering off portions of the addressing system that are not being used to address memory cells corresponding to the address signal comprises generating a count of portions of the addressing system that are being used to address the memory cells corresponding to the address signal and powering off the remaining portions of the addressing system.

135. The method of claim 130 wherein the act of refreshing the memory cells comprises refreshing the memory cells in a burst refresh mode.

136. The method of claim 130 wherein the act of refreshing the memory cells comprises refreshing the memory cells in a distributed refresh mode.

137. A method for refreshing a PC memory array comprised of PCmemory cells that must be refreshed after an extended refresh interval, an addressing system operably connected to the memory array, the addressing system responsive to an address signal by accessing PCmemory cells in the memory array corresponding to the address signal, a refresh controller generating a refresh signal, a refresh counter operably connected to the addressing system generating the address signal of the PCmemory cells in the memory array in response to a refresh command, the method comprising:

counting a predetermined number of the refresh signals from the refresh controller without initiating a refresh cycle; and initiating a refresh of at least some of the PCmemory cells after the predetermined number of the refresh signals have been counted.

138. The method of claim 137 further comprising powering off the addressing system when no address signal is being received.

139. The method of claim 138 wherein the act of powering off the addressing system when no address signal is being received comprises selectively powering off portions of the addressing system that are not being used to address PCmemory cells corresponding to the address signal.

140. The method of claim 139 further comprising generating a count of portions of the addressing system that are being used to address the PCmemory cells corresponding to the address signal and powering off the remaining portions of the addressing system.

141. The method of claim 137 wherein the rows of PCmemory cells are refreshed in a burst refresh mode.

142. The method of claim 137 wherein the PCmemory cells are refreshed in a distributed refresh mode.

143. A method for refreshing a memory array comprised of PCmemory cells that must be refreshed within an extended refresh interval, an addressing system operably connected to the memory array responsive to an address signal by accessing PCmemory cells in the memory array corresponding to the address signal, a refresh controller generating a refresh signal, a refresh counter operably connected to the addressing system generating the address signal of the PCmemory cells in the memory array in response to a refresh command, the method comprising:

receiving and ignoring a number of the refresh signals from the refresh controller without initiating a refresh cycle; and initiating a refresh of at least some of the PCmemory cells responsive to a refresh signal that is not ignored.

144. The method of claim 143 further comprising powering off the addressing signal when no address signal is being received.

145. The method of claim 144 wherein the act of powering off the addressing system when no address signal is being received comprises selectively powering off portions of the addressing system that are not being used to address a PC memory cell corresponding to the address signal.

146. The method of claim 145 further comprising generating a count of portions of the addressing system that are being used to address the PCmemory cells corresponding to the address signal.

147. The method of claim 143 wherein the rows of PCmemory cells in the memory array are refreshed in a burst refresh mode.

148. The method of claim 143 wherein the rows of PCmemory cells in the memory array are refreshed in a distributed refreshed mode.

* * * * *

UNITED STATES PATENT AND TRADEMARK OFFICE

CERTIFICATE OF CORRECTION

PATENT NO. : 6,930,944 B2
APPLICATION NO. : 10/418945
DATED : August 16, 2005
INVENTOR(S) : Glen Hush It is certified that error appears in the above-identified patent and that said Letters Patent is hereby corrected as shown below:

| Column, Line | Reads | Should Read |
|---|---|---|
| Column 4, Line 53 | "memory cell is **200** not" | --memory cell **200** is not-- |
| Column 6, Line 9 | "the amount power wasted" | --the amount of power wasted-- |
| Column 7, Line 12 | "frequency f could be many orders" | --frequency f' could be many orders-- |
| Column 15, Line 38 | "corresponding to row address signal;" | --corresponding to a row address signal; |
| Column 16, Line 39 | "after arefresh interval;" | --after a refresh interval;-- |
| Column 19, Line 59 | "which causing the subsystem" | --which causes the subsystem-- |
| Column 21, Line 25 | "on when a address signal" | --on when an address signal-- |
| Column 22, Line 17 | "a addressing system" | --an addressing system-- |
| Column 23, Line 33 | "memory array m response" | --memory array in response-- |
| Column 23, Line 39 | "refreshed at refresh interval," | --refreshed at a refresh interval,-- |
| Column 23, Line 61 | "memory may subsection" | --memory array subsection-- |
| Column 24, Line 7 | "wherein the may" | --wherein the array-- |
| Column 24, Line 10 | "when a address signal" | --when an address signal-- |
| Column 24, Lines 13 and 16 | "memory may are refreshed" | --memory array are refreshed-- |

UNITED STATES PATENT AND TRADEMARK OFFICE

CERTIFICATE OF CORRECTION

PATENT NO. : 6,930,944 B2
APPLICATION NO. : 10/418945
DATED : August 16, 2005
INVENTOR(S) : Glen Hush It is certified that error appears in the above-identified patent and that said Letters Patent is hereby corrected as shown below:

| Column, Line | Reads | Should Read |
|---|---|---|
| Column 24, Line 35 | "signal of the PC memory" | --signal of the PCmemory-- |
| Column 24, Line 59 | "being operable to addresses" | --being operable to address-- |
| Column 26, Line 29 | "refreshing a PC memory" | --refreshing a PCmemory-- |
| Column 28, Line 3 | "a PC memory cell" | a PCmemory cell-- |

Signed and Sealed this

Twenty-sixth Day of February, 2008

JON W. DUDAS
*Director of the United States Patent and Trademark Office*